United States Patent

Murakami et al.

Patent Number: 5,834,369
Date of Patent: Nov. 10, 1998

[54] METHOD OF PREVENTING DIFFUSION BETWEEN INTERCONNECT AND PLUG

[75] Inventors: Tomoyasu Murakami, Suita; Kousaku Yano, Katano, both of Japan

[73] Assignee: Matsushita Electric Industrial Co., Ltd., Osaka, Japan

[21] Appl. No.: 594,225

[22] Filed: Jan. 31, 1996

[30] Foreign Application Priority Data

Feb. 2, 1995 [JP] Japan ................................ 7-015768

[51] Int. Cl.⁶ ................................................ H01L 21/28
[52] U.S. Cl. ............................ 438/625; 438/627; 438/643; 438/648; 438/672
[58] Field of Search .................................. 438/625, 627, 438/659, 643, 648, 672, 634, 970, 192, 194

[56] References Cited

U.S. PATENT DOCUMENTS

| | | | |
|---|---|---|---|
| 4,624,864 | 11/1986 | Hatmann ............................... | 438/643 |
| 5,252,177 | 10/1993 | Hong et al. . | |
| 5,256,597 | 10/1993 | Gambino ............................... | 438/625 |
| 5,312,773 | 5/1994 | Nagashima . | |
| 5,372,971 | 12/1994 | Kang et al. ........................... | 438/627 |
| 5,420,070 | 5/1995 | Matsuura et al. . | |
| 5,470,790 | 11/1995 | Myers et al. ......................... | 438/625 |

FOREIGN PATENT DOCUMENTS

| | | |
|---|---|---|
| 4-7825 | 1/1992 | Japan . |
| 4-152631 | 5/1992 | Japan . |
| 4-258153 | 9/1992 | Japan . |
| 5-109903 | 4/1993 | Japan . |

*Primary Examiner*—John Niebling
*Assistant Examiner*—Thomas Bilodeau
*Attorney, Agent, or Firm*—McDermott, Will & Emery

[57] ABSTRACT

There are provided the steps of: forming a connection hole in an interlayer insulating film overlying a lower metal interconnection; forming a W plug in the connection hole; forming a first metal film and a second metal film over the interlayer insulating film and the W plug; forming an interconnection underlying film by using a photoresist mask with no alignment margin; and forming a diffusion preventing film made of a titanium fluoride or the like over the W plug, while etching away the exposed part of the first metal film. Reciprocal diffusion of tungsten and aluminum is prevented by the titanium fluoride or the like, thereby preventing the formation of an alloy having high electric resistivity. As a result, an alloy having high electric resistivity resulting from the reaction between the metal plug and the upper metal interconnection is prevented from being formed and a semiconductor device which is high in reliability and integration is provided through the manufacturing process involving no alignment margin.

18 Claims, 16 Drawing Sheets

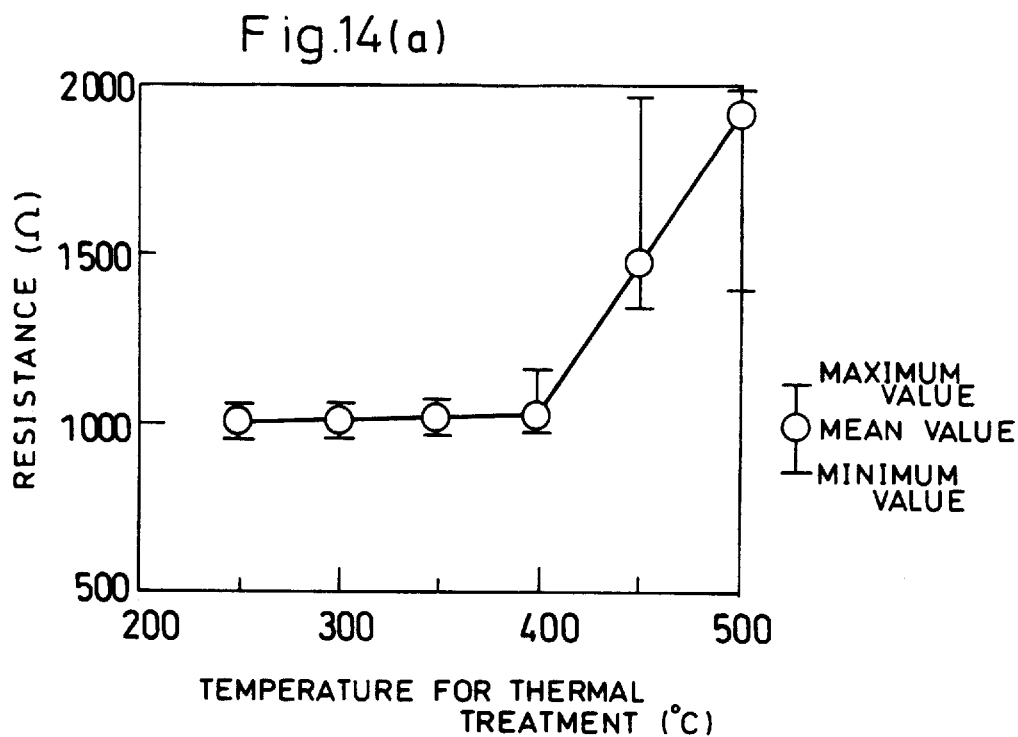
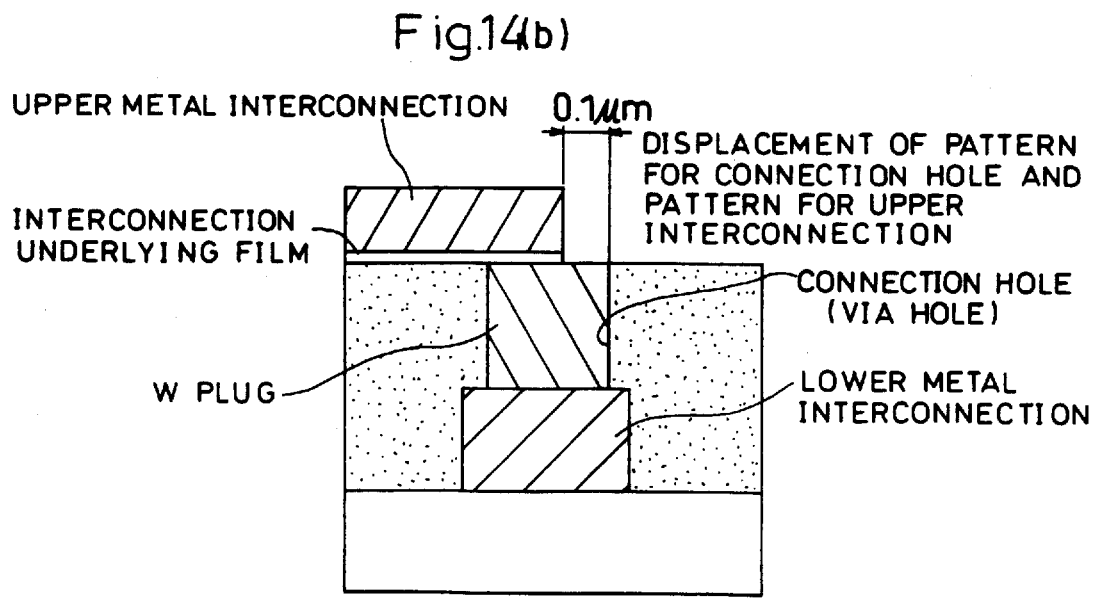

METHOD OF PREVENTING DIFFUSION BETWEEN INTERCONNECT AND PLUG

BACKGROUND OF THE INVENTION

The present invention relates to a semiconductor device having a metal interconnect layer to be brought into contact with an underlying conductive layer via a metal plug made of a refractory metal such as tungsten and filled in a connection hole and to a method of manufacturing the same. More particularly, it relates to a method of improving the performance of a semiconductor device manufactured through a marginless patterning process for forming the metal interconnect layer.

As higher integration and higher density have been achieved in ULSIs in recent years, a connection hole for connecting individual metal interconnect layers has been increasingly reduced in size, which necessitates a method of filling the connection hole with metal with excellent coverage. For example, there has been adopted a method of forming a so-called metal plug whereby tungsten is deposited by chemical vapor deposition (hereinafter referred to as CVD) over the entire surface of a substrate (blanket tungsten) and the entire surface is then etched so as to partially remove unnecessary tungsten except for the portion lying in the connection hole (etch back), thereby filling tungsten only in the connection hole.

In the case where an aluminum-based metal is deposited by sputtering, without forming such a metal plug, so as to fill the connection hole and form the metal interconnect layer simultaneously, it has customarily been necessary to design an ULSI such that the metal interconnect layer is surely formed in a given peripheral area around the connection hole in consideration of a displacement of a mask pattern for forming the connection hole and a mask pattern for forming the metal interconnect layer. The given peripheral area, termed an alignment margin, is provided because, if an area underlying an opening of the mask for forming the metal interconnect layer includes a part of the connection hole, the aluminum-based metal in the connection hole is also etched, resulting in a disconnection. FIG. 16(a) is a plan view illustrating the relationship between the alignment margin and the width of the interconnection. As can be seen from the drawing, when each of the outer dimension of the underlying filled metal (or alternatively an underlying film) and the width of the metal interconnection is a, the metal interconnection is increased in width by b for each side, which corresponds to the alignment margin, only at a portion connected to the filled metal.

However, in the case where the connection hole is filled with tungsten and the metal film is patterned by selective etching to form the metal interconnect layer, as described above, even when the mask for etching does not completely cover the filled metal in the connection hole, i.e., even when that part of the metal film for interconnection corresponding to the opening of the mask for etching is removed and the metal filled in the connection hole is partially exposed, the filled metal is not etched by an etchant for an aluminum interconnection provided that it is a refractory metal such as tungsten. This eliminates the necessity for the alignment margin and achieves higher density in the LSI. In other words, it is sufficient for the portion of the metal interconnection connected to the filled metal to have the same width a as that of the other portion thereof, as shown in FIG. 16(b).

Referring now to FIGS. 15(a) to 15(b), a description will be given below to a method of filling metal in a connection hole between metal interconnection by using blanket tungsten CVD and etch back, which exemplifies the conventional technology. Here, the description will be given to a method of filling a refractory metal in the connection hole in accordance with a so-called marginless process whereby the metal interconnection are formed using a mask with no alignment margin for the mask used in forming the connection hole.

Initially, as shown in FIG. 15(a), a lower metal interconnection 2 is formed on a substrate 1 on which transistors and the like have been formed. On the lower metal interconnection 2 is formed an interlayer insulating film 3 composed of a silicon dioxide film by, e.g., plasma CVD, followed by the formation of a connection hole 4 by dry etching in a desired position of the interlayer insulating film 3 on the lower metal interconnection 2. Next, as a layer for providing satisfactory adhesion of tungsten to the underlayer, a TiN/Ti film 5a is deposited by sputtering, which is a multilayer film consisting of a titanium layer with a thickness of about 20 nm and a titanium nitride layer with a thickness of about 100 nm. Thereafter, over the interlayer insulating film 3 and the connection hole 4 is deposited a tungsten film 6a by blanket tungsten CVD to a thickness of about 600 nm, thereby filling the connection hole 4 with the tungsten film 6a. It is to be appreciated that the thickness of the deposited tungsten film 6a depends on the diameter of the connection hole 4. FIG. 15(a) shows the case where the connection hole 4 has a diameter of about 600 nm.

Next, as shown in FIG. 15(b), the tungsten film 6a and the TiN/Ti film 5a on the interlayer insulating film 3 is evenly and sequentially removed by dry etching, except for the portion lying inside the connection hole 4, thereby leaving a W plug 6 and a plug underlying film 5 composed of the TiN/Ti film in the connection hole 4. Furthermore, a first metal film 9a which is a multilayer film consisting of a titanium layer having a thickness of about 10 and a titanium nitride layer having a thickness of about 100 nm as well as a second metal film 7a having a thickness of about 600 nm and composed of an alloy aluminum containing about 1% of silicon and about 0.5% of copper are sequentially formed by sputtering. In the first metal film 9a, the titanium layer is for achieving excellent electric connection by reducing an oxide between the metals, while the titanium nitride layer is for enhancing the resistance of aluminum to electromigration (migration of metal atoms caused by an electric current). With the formation of the first metal film 9a, direct contact between tungsten composing the W plug 6 and aluminum composing the upper metal interconnection is prevented, thereby preventing the generation of an alloy of tungsten and aluminum.

Next, as shown in FIG. 15(c), a photoresist is applied to form a photoresist mask for forming an upper metal interconnection in a specified configuration. During the process, however, a slight displacement of the pattern of the mask for forming the upper metal interconnection 4 and the pattern of the mask used in forming the connection hole 4 may cause the edge portion of the photoresist mask 8 to be located over the connection hole 4. With the use of the photoresist mask 8, the second metal film 7a and the first metal film 9a are processed into a desired pattern, thereby forming an upper metal interconnection 7 and an interconnection underlying film 9, respectively. Thereafter, as shown in FIG. 15(d), the photoresist mask 8 is removed and a dielectric film 11 is deposited, followed by a thermal treatment at 450° C. The thermal treatment is performed in order to restore the damage caused by dry etching to the underlay and to stabilize the interface between the metals. This thermal treatment is also given at the following film deposition (deposition temperature).

Although the above conventional embodiment has shown the TiN/Ti multilayer film as an example of the layer for improving the adhesion of tungsten to the underlay, a film of refractory metals such as tungsten and TiW has also been used.

Although the above conventional embodiment has described the case where the connection hole is a via hole connecting the individual metal interconnect layers to each other, the same shall apply to the case where the connection hole is a contact hole connecting a semiconductor region to the metal interconnect layer.

However, the semiconductor device manufactured in accordance with the above method is disadvantageous in that the metal interconnection or the like used therein frequently suffers faults.

This may be attributed to the thermal treatment for damage restoration performed after the formation of the upper metal interconnection wherein a reaction may occur between tungsten and aluminum to form an alloy of tungsten and aluminum ($WAl_{12}$). Since the resulting alloy ($WAl_{12}$) has a high electric resistivity, it produces heat when a current flows therethrough, which gives rise to faults such as the breakage of the metal interconnection. The formation of the alloy resulting from the reaction between tungsten and aluminum may also be attributed to the diffusion of aluminum atoms into the W plug 6 or the diffusion of the tungsten atoms into the upper metal interconnection 7 in the subsequent thermal treatment process, each of which occurs via the region ReA shown in FIG. 15($d$) since the edge portion of the upper metal interconnection containing aluminum has been located over the W plug in the foregoing marginless process. In this case, if a sufficient margin is provided in consideration of a displacement of the mask for forming the connection hole and the mask for forming the upper metal interconnection, such an alloy layer of aluminum and tungsten is not formed since the upper surface of the W plug 6 is completely covered with the interconnection underlying film 9 made of titanium or the like. However, the provision of such a sufficient margin may present an obstacle to the high integration of the semiconductor device.

The above problems similarly occur even in selective tungsten CVD in which tungsten is selectively formed in a via hole by using CVD. The problems may also occur even when the metal plug is made of a metal other than tungsten and the upper metal interconnection is made of a metal other than aluminum.

SUMMARY OF THE INVENTION

The present invention has been achieved in view of the foregoing. It is therefore an object of the present invention to provide a semiconductor device and a method of manufacturing the same which can prevent an increase in electric resistivity due to the formation of an alloy resulting from the reciprocal diffusion of the metal composing the metal plug and the metal composing the upper metal interconnection in the case where the pattern for forming the upper metal interconnection is provided with no alignment margin for the pattern for forming the connection hole.

To attain the above object, in the metal plug formed through the marginless process to have a part uncovered with the metal interconnection with an edge portion of the metal interconnection positioned thereover, the present invention prevents the reciprocal diffusion of the constituent atoms of the metal interconnection and the constituent atoms of the metal plug via that part of the metal plug which is uncovered with the metal interconnection or alternatively prevents a reaction between the respective constituent atoms even when the reciprocal diffusion has occurred.

A first method of manufacturing a semiconductor device of the present invention comprises: a first step of forming a dielectric film on a semiconductor substrate having a conductive layer; a second step of forming a connection hole which penetrates the above dielectric film and leads to the above conductive layer; a third step of forming a metal plug composed of a refractory metal such as tungsten in the above connection hole; a fourth step of depositing, over the above dielectric film and the above metal plug, a first metal film to form an interconnection underlying film; a fifth step of depositing, on the above first metal film, a second metal film composed of a metal which reacts with the above refractory metal composing the above metal plug so as to form a high-resistance compound a sixth step of forming a photoresist mask on the above second metal film such that the above photoresist mask covers at least a part of the above metal plug; a seventh step of selectively removing the above second metal film by etching using the above photoresist mask so as to form a metal interconnection to be connected to the above metal plug; an eighth step of etching away that part of the above first metal film which has its top surface exposed in the above seventh step; and a ninth step of forming, over that part of the above metal plug which has its top surface uncovered with the above first metal film directly below the above metal interconnection, a diffusion preventing film for preventing respective constituent atoms of the above metal interconnection and the above metal plug from being reciprocally diffused.

By the method, in the case where the photoresist mask for forming the metal interconnection has no alignment margin or only an extremely small alignment margin for the mask used in forming the connection hole, the top surface of the metal plug may not be covered completely with the first metal film directly below the metal interconnection. That part of the metal plug which is uncovered with the first metal film is covered with a diffusion preventing film which is formed thereon in the subsequent ninth step in accordance with the method. Consequently, even when the thermal treatment is performed thereafter, the diffusion preventing film prevents the reaction between the reciprocal diffusion of the respective constituent atoms of the metal interconnection and metal plug, which have been reciprocally diffused. As a result, there is prevented the formation of an alloy layer which might adversely effect on the characteristics of the semiconductor device, such as an alloy layer having high electric resistivity.

The above first method of manufacturing a semiconductor device may adopt the following preferred embodiments.

In the above third step, the above metal plug can be composed of tungsten. In the above fourth step, the above first metal film can be composed of a compound containing titanium. In the above fifth step, the above second metal film can be composed of a metal containing aluminum. In the above ninth step, the above diffusion preventing film can be composed of a compound containing titanium.

The method can particularly effectively prevent an increase in resistance between the metal interconnection and the metal plug due to $WAl_{12}$ which is a highly resistant compound resulting from the reaction between tungsten and aluminum.

Each of the above seventh step and the above eighth step can be performed by dry etching and the above diffusion preventing film can be formed by depositing a compound containing titanium resulting from a reaction between titanium atoms liberated in etching the above first metal film and a decomposition product of the above etchant gas over that part of the above metal plug which has its top surface exposed.

By the method, since the removal of the first metal film and the formation of the diffusion preventing film proceed simultaneously, the manufacturing process is simplified.

The above diffusion preventing film formed in the above ninth step can have a thickness of 5 to 20 nm.

The method ensures the removal of the first metal film and the deposition of the diffusion preventing film, while ensuring the proper functioning of the diffusion preventing film.

The above ninth step can be performed by dry etching using a gas containing fluorine so as to compose the above diffusion preventing film of a titanium fluoride.

The above gas containing fluorine can be at least any one of $SF_6$ gas, $CF_4$ gas, $CHF_3$ gas, and $NF_3$ gas.

By these methods, since the reciprocal diffusion of aluminum atoms and tungsten atoms is surely prevented by a titanium fluoride film that has been formed, an increase in resistance of the metal plug or metal interconnection due to the generation of the compound $WAl_{12}$ can effectively be prevented.

In the above ninth step, after the above photoresist mask is removed, a film composed of a material having the function of preventing the respective constituent atoms of the above metal interconnection and the above metal plug from being reciprocally diffused can be deposited over the above metal interconnection, the exposed part of the above metal plug, and the above dielectric film and the above film can be etched back so as to form sidewalls extending over respective side faces of the above metal interconnection and the above first metal film and a part of the top surface of the above metal plug.

By the method, the sidewalls having a diffusion preventing function are formed over a portion at which the metal plug and metal interconnection are contiguous to each other. Consequently, the reciprocal diffusion of the respective constituent atoms of the metal interconnection and metal plug is surely prevented.

In this case, the above film deposited in the above ninth step so as to form the above sidewalls can be a silicon nitride film.

By this method, the silicon nitride film rather than an oxide film commonly used as an interlayer insulating film is provided at the portion at which the metal interconnection and the metal plug are contiguous to each other so as to perform the function of preventing the diffusion of metal atoms more effectively, thereby preventing the reciprocal diffusion of the respective constituent atoms of the metal interconnection and metal plug.

Alternatively, after the above fifth step and prior to the above sixth step, there can be further provided the step of depositing a protective insulating film on the above second metal film and, in the above ninth step, the above film can be composed of a titanium film and the above sidewalls can be formed to extend over respective side faces of the above first and second metal films and a part of the top surface of the above metal plug.

By this method, the sidewalls composed of the titanium film can effectively prevent the reciprocal diffusion of the constituent atoms of the metal interconnection and metal plug. Alternatively, there can be formed a layer for preventing the formation of the high-resistance compound by causing the diffused atoms to react with titanium. Moreover, even when the metal interconnection and the metal plug are formed in considerably shifted positions due to a displacement of the masks and hence a contact area therebetween is reduced, an increase in resistance value can be prevented since electric conduction is achieved via the sidewalls composed of the titanium film. Furthermore, since the sidewalls are formed by self alignment, it is easy to prevent contact between the sidewalls and their adjacent conductive members.

A second method of manufacturing a semiconductor device according to the present invention comprises: a first step of forming a dielectric film on a semiconductor substrate having a conductive layer; a second step of forming a connection hole which penetrates the above dielectric film and leads to the above conductive layer; a third step of forming a metal plug composed of a refractory metal such as tungsten in the above connection hole; a fourth step of depositing, over the above dielectric film and the above metal plug, a first metal film to form an interconnection underlying film; a fifth step of depositing, on the above first metal film, a second metal film composed of a metal which reacts with the above refractory metal composing the above metal plug so as to form a high-resistance compound; a sixth step of forming a photoresist mask on the above second metal film such that the above photoresist mask covers at least a part of the above metal plug; a seventh step of selectively removing the above second metal film by etching using the above photoresist mask so as to form a metal interconnection to be connected to the above metal plug; an eighth step of etching away that part of the above first metal film which has its top surface exposed in the above seventh step; and a ninth step of forming a recessed portion by etching away that part of the above metal plug which is uncovered with the above first metal film directly below the above metal interconnection from a top surface thereof to a specified depth.

By the method, the metal plug becomes closest to the side faces of the metal interconnection at the side faces of the recessed portion formed therein. As a result, the distance between the respective contiguous portions of the metal plug and metal interconnection becomes larger than the distance between the top surface of the metal plug and the side faces of the metal interconnection in the case where the metal plug is formed with no recessed portion. Consequently, the reciprocal diffusion of the respective constituent atoms of the metal interconnection and metal plug is minimized.

Preferably, the above recessed portion formed in the above ninth step has a depth of about 100 nm. If the recessed portion is excessively deep, a void is formed therein in the subsequent process. Conversely, if the recessed portion is excessively shallow, a sufficient effect cannot be obtained.

The above first and second methods of manufacturing a semiconductor device can be embodied in the following preferred forms in forming the metal interconnection underlying film and the metal plug underlying film.

The above third step can be performed so as to add an underlying film to the above metal plug.

By this method, if a proper material is selected for the underlying film, it becomes possible to devise a means to prevent the reciprocal diffusion of the respective constituent atoms of the metal plug and its underlying conductive layer or to improve the adhesion of the metal plug to the underlying conductive layer.

Alternatively, the method may also comprise: a first step of forming a dielectric film on a semiconductor substrate having a conductive layer; a second step of forming a connection hole which penetrates the above dielectric film and leads to the above conductive layer; a third step of depositing, over side and bottom faces of the above contact hole and the above dielectric film, a first metal film to form an interconnection underlying film; a fourth step of forming a metal plug composed of a refractory metal such as tungsten on the above first metal film in the above connection hole; a fifth step of depositing, over the above first metal film and the above metal plug, a second metal film to form an interconnection underlying film; a sixth step of depositing, on the above second metal film, a third metal film composed of a metal which reacts with the above refractory metal composing the above metal plug so as to form a high-resistance compound; a seventh step of forming a photoresist mask on the above third metal film such that it covers at least a part of the above metal plug; an eighth step of selectively removing the above second and third metal films, while leaving the above first metal film, by etching using the above photoresist mask so as to form a metal interconnection to be connected to the above metal plug; and a ninth step of forming, over that part of the above metal plug which has its top surface uncovered with the above second metal film directly below the above metal interconnection, a diffusion preventing film for preventing respective constituent atoms of the above metal interconnection and the above metal plug from being reciprocally diffused, while etching away that part of the above first metal film which has its top surface exposed in the above eighth step.

By this method, the metal plug underlying film is formed from the third metal film at the same time as the metal interconnection underlying film is formed from a multilayer film consisting of the first metal film and the third metal film. Accordingly, proper selection and combination of the materials of the multilayer film can further reduce the electric resistance of the metal interconnection and prevent electromigration.

Alternatively, the method may also comprise: a first step of forming a dielectric film on a semiconductor substrate having a conductive layer; a second step of depositing, on the above dielectric film, a first metal film to form an interconnection underlying film; a third step of forming a connection hole which penetrates the above first metal film and the above dielectric film and leads to the above conductive layer; a fourth step of forming a metal plug composed of a refractory metal such as tungsten in the above connection hole; a fifth step of depositing, over the above first metal film and the above metal plug, a second metal film to form an interconnection underlying film; a sixth step of depositing, on the above second metal film, a third metal film composed of a metal which reacts with the above refractory metal composing the above metal plug so as to form a high-resistance compound; a seventh step of forming a photoresist mask on the above third metal film such that it covers at least a part of the above metal plug; an eighth step of selectively removing the above second and third metal films, while leaving the above first metal film, by etching using the above photoresist mask so as to form a metal interconnection to be connected to the above metal plug; and a ninth step of forming, over that part of the above metal plug which has its top surface uncovered with the above second metal film directly below the above metal interconnection, a diffusion preventing film for preventing respective constituent atoms of the above metal interconnection and the above metal plug from being reciprocally diffused, while etching away that part of the above first metal film which has its top surface exposed in the above eighth step.

By this method, the metal plug is provided with no underlying metal film, while the interconnection underlying film is formed from the multilayer film, so that proper selection and combination of the materials of the multilayer film can further reduce the electric resistance of the metal interconnection and prevent electromigration.

A third method of manufacturing a semiconductor device of the present invention comprises: a first step of forming a dielectric film on a semiconductor substrate having a conductive layer; a second step of forming a connection hole which penetrates the above dielectric film and leads to the above conductive layer; a third step of forming a metal plug composed of a metal containing at least tungsten in the above connection hole; a fourth step of depositing a first metal film composed of a metal containing titanium over the above dielectric film and the above metal plug; a fifth step of depositing a second metal film composed of a metal containing aluminum on the above first metal film; a sixth step of forming a reaction layer composed of a compound of titanium and aluminum between the above first metal film and the above second metal film through a heating process at 350° C. to 430° C.; a seventh step of forming a photoresist mask on the above second metal film such that it covers at least a part of the above metal film; an eighth step of selectively removing the above second metal film by etching using the above photoresist mask so as to form a metal interconnection to be connected to the above metal plug; and a ninth step of etching away that part of the above first metal film which has its top surface exposed in the above eighth step.

By this method, the reaction layer composed of a compound of Al and Ti is formed between the metal interconnection and the titanium film serving as the interconnection underlying film. Since the reaction layer composed of the compound of Al and Ti is excellent in the function of preventing the aluminum atoms and tungsten atoms from passing through, the aluminum atoms composing the metal interconnection are prevented from being diffused into the metal plug and the tungsten atoms composing the metal plug are prevented from being diffused into the metal interconnection. In particular, since the reaction layer is formed along the interconnection underlying film, it reliably performs the foregoing diffusion preventing function even when the interconnection underlying film cannot effectively prevent the diffusion of the aluminum atoms and tungsten atoms.

By adding the structures of the above first and second methods of manufacturing a semiconductor device to the above third method of manufacturing a semiconductor device, the generation of a compound which might adversely effect the characteristics of the semiconductor device can be prevented more effectively. Specifically, the following combinations are possible.

After the above ninth step, there can be further provided a tenth step of forming a diffusion preventing film for preventing respective constituent atoms of the above metal interconnection and the above metal plug from being reciprocally diffused over that part of the above metal plug which is uncovered with the above first metal film directly below the above metal interconnection.

Each of the above ninth step and the above tenth step can be performed by dry etching and the above diffusion preventing film can be formed by depositing a compound of titanium resulting from a reaction between titanium atoms liberated in etching the above first metal film and a decomposition product of the above etchant gas over that part of the above metal plug which has its top surface exposed.

In the above tenth step, after the above photoresist mask is removed, a film composed of a material having the function of preventing the respective constituent atoms of the above metal interconnection and the above metal plug from being reciprocally diffused can be deposited over the above metal interconnection, the exposed part of the above metal plug, and the above dielectric film and the above film can be etched back so as to form sidewalls extending over respective side faces of the above metal interconnection and the above first metal film and a part of the top surface of the above metal plug.

After the above ninth step, there can be further provided the step of etching away that part of the above metal plug which is uncovered with the above first metal film directly below the above metal interconnection from a top surface thereof to a specified depth.

A first semiconductor device of the present invention comprises: a semiconductor substrate; a conductive layer provided in a part of the above semiconductor substrate; a dielectric film formed over the above semiconductor substrate and the above conductive layer; a metal plug composed of a refractory metal such as tungsten filled in a connection hole which penetrates the above dielectric film and leads to the above conductive layer; an interconnection underlying film formed over a part of the above dielectric film and at least a part of the above metal plug; a metal interconnection formed on the above interconnection underlying film and composed of a metal which reacts with the above refractory metal composing the above metal plug so as to form a high-resistance compound; and a diffusion preventing film formed over that part of the above metal plug which is uncovered with the above interconnection underlying film so as to prevent respective constituent atoms of the above metal interconnection and the above metal plug from being reciprocally diffused.

With the structure, the first semiconductor device is formed by the above first method of manufacturing a semiconductor device. Since the diffusion preventing film is formed over that part of the metal film which has its top surface uncovered by the interconnection underlying film, respective constituent atoms of the metal interconnection and metal plug are prevented from being reciprocally diffused even when the semiconductor substrate is under a high-temperature treatment. Since the semiconductor device is so constituted that the alloy layer which might adversely effect the characteristics of the semiconductor device, such as an alloy layer with high electric resistivity, is prevented from being formed in the metal plug or in the metal interconnection, the semiconductor device can retain their excellent characteristics.

The preferred embodiments of the above first method of manufacturing a semiconductor device can be embodied in the preferred forms of the first semiconductor device. The preferred embodiments can achieve the effects previously described.

The above metal plug can be composed of a metal containing tungsten. The above metal interconnection can be composed of a metal containing aluminum. The above interconnection underlying film can be composed of a metal containing titanium. The above diffusion preventing film can be composed of a titanium fluoride.

The above film composed of a material containing titanium can have a thickness of 5 to 20 nm.

The above diffusion preventing film can be sidewalls formed to extend over respective side walls of the above metal interconnection and the above interconnection underlying film and a part of the top surface of the above metal plug.

The above sidewalls can be composed of a silicon nitride film.

The above sidewalls can be composed of a titanium film.

A second semiconductor device of the present invention comprises: a semiconductor substrate; a conductive layer provided in a part of the above semiconductor substrate; a dielectric film formed over the above semiconductor substrate and the above conductive layer; a metal plug composed of a refractory metal such as tungsten filled in a connection hole which penetrates the above dielectric film and leads to the above conductive layer; an interconnection underlying film formed over a part of the above dielectric film and at least a part of the above metal plug; a metal interconnection formed on the above interconnection underlying film and composed of a metal which reacts with the above refractory metal composing the above metal plug so as to form a high-resistance compound; and a recessed portion formed by removing that part of the above metal plug which is included in an area uncovered with the above interconnection underlying film from a top surface thereof to a given depth.

With the structure, the distance between the respective surfaces of the metal interconnection and metal plug through which the constituent atoms are to be diffused is increased at the portion at which the metal interconnection and the metal plug are contiguous to each other. Consequently, the reciprocal diffusion of the respective constituent atoms of the metal interconnection and metal plug is minimized, thereby preventing the generation of the compound which might adversely effect the characteristics of the semiconductor device.

Preferably, the above recessed portion of the above metal plug has a depth of about 100 nm.

A third semiconductor device of the present invention comprises: a semiconductor substrate; a conductive layer provided in a part of the above semiconductor substrate; a dielectric film formed over the above semiconductor substrate and the above conductive layer; a metal plug composed of a refractory metal such as tungsten filled in a connection hole which penetrates the above dielectric film and leads to the above conductive layer; an interconnection underlying film formed over a part of the above dielectric film and at least a part of the above metal plug and composed of a metal containing titanium; a metal interconnection formed on the above interconnection underlying film and composed of a metal containing aluminum; and a reaction layer formed between the above interconnection underlying film and the above metal interconnection and composed of a compound of titanium and aluminum.

With the structure, the aluminum atoms in the metal interconnection can be prevented from being diffused into the metal plug and the tungsten atoms in the metal plug can be prevented from being diffused into the metal interconnection.

In particular, even when the interconnection underlying film cannot sufficiently perform the function of preventing the respective constituent atoms from being diffused, the diffusion of the respective constituent atoms through the interconnection underlying film can effectively be prevented.

The structures of the above first and second semiconductor devices can be added to the above third semiconductor device, thereby preventing the generation of the compound which might adversely effect the characteristics of the semiconductor device more effectively. Specifically, the following preferred structures can be adopted.

There can be further provided a diffusion preventing film formed over that portion of the above metal plug which has its top surface uncovered with the above interconnection underlying film so as to prevent respective constituent atoms of the above metal interconnection and the above metal plug from being reciprocally diffused.

The above diffusion preventing film can be composed of a titanium fluoride.

The above diffusion preventing film can be sidewalls formed to extend over respective side walls of the above metal interconnection and the above interconnection underlying film and a part of the top surface of the above metal plug.

There can be further provided a recessed portion formed by removing that portion of the above metal plug which is uncovered with the above interconnection underlying film from a top surface thereof to a specified depth.

BRIEF DESCRIPTION OF THE DRAWINGS

FIG. 14(a) shows data indicating variations in electric resistivity resulting from different temperatures for thermal treatments according to other embodiments and FIG. 14(b) is a cross-sectional view of a semiconductor device formed to obtain the data;

DETAILED DESCRIPTION OF THE INVENTION (First Embodiment)

A description will be given below to a first embodiment with reference to FIGS. 1(a) to 1(d), which are cross-sectional views illustrating the process of manufacturing a semiconductor device according to the first embodiment. In the present embodiment, there will be described the case where a silicon dioxide film is formed as a dielectric film over a lower metal interconnection, a connection hole is formed in the silicon dioxide film, a W plug is formed in the connection hole, an upper metal interconnection is composed of an alloy film of aluminum, an interconnection underlying film is composed of a single-layer film of titanium, and a diffusion preventing film is formed over the surface of the W plug by using sulfur hexafluoride ($SF_6$).

Figure 1A:
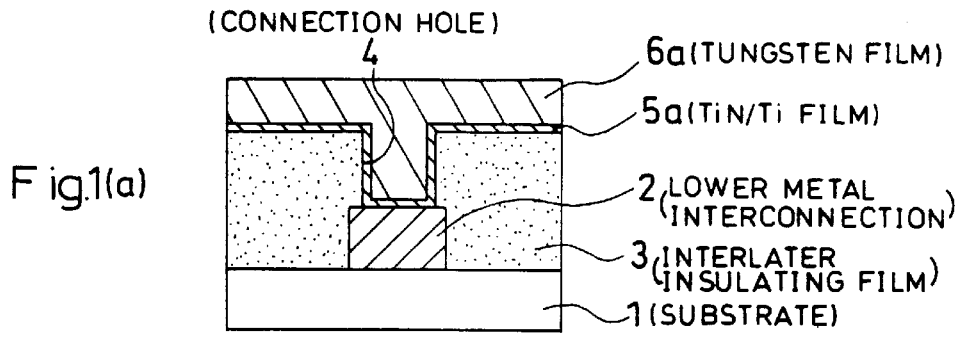
FIGS. 1(a) to 1(d) are cross-sectional views illustrating the process of manufacturing a semiconductor device according to a first embodiment.

Initially, as shown in FIG. 1(a), a lower metal interconnection (conductive layer) 2 consisting of, e.g., an alloy film of aluminum, a titanium film, and a titanium nitride film is formed on a substrate 1 on which transistors and the like have previously been formed. After an interlayer insulating film 3 composed of a silicon dioxide film is formed thereon by, e.g., plasma CVD, a part of the interlayer insulating film 3 is selectively removed by dry etching so as to form a connection hole 4 which leads to a part of the lower metal interconnection 2. Next, a TiN/Ti film 5a which is a multi-layer film consisting of a titanium layer with a thickness of about 20 nm and a titanium nitride layer with a thickness of about 100 nm is deposited by sputtering over the entire surface so as to improve the adhesion of tungsten to be deposited thereon. On the TiN/Ti film 5a is further deposited a tungsten film 6a with a thickness of about 600 nm by blanket tungsten CVD, which fills in the connection hole 4 and covers up the interlayer insulating film 3. It is to be appreciated that the thickness of the deposited tungsten film 6a depends on the diameter of the connection hole 4. FIGS. 1 shows the case where the diameter of the connection hole 4 is about 600 nm.

Figure 1B:
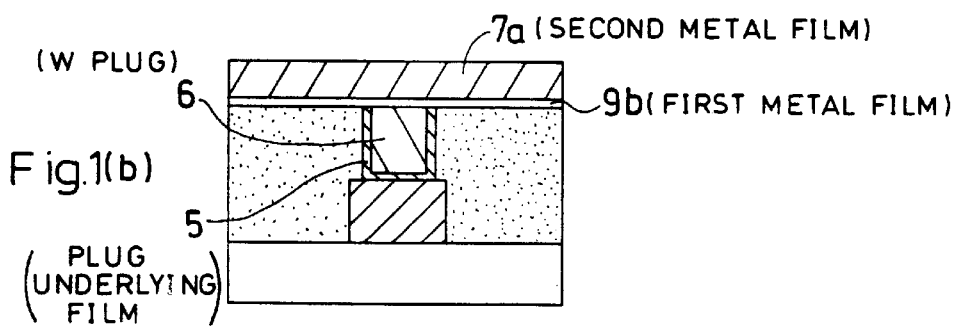

Next, as shown in FIG. 1(b), the tungsten film 6a and TiN/Ti film 5a on the interlayer insulating film 3 are evenly and sequentially removed except for the portion lying inside the connection hole 4, thereby leaving the a W plug 6 and a plug underlying film 5 in the connection hole 4. Subsequently, a first metal film 9b having a thickness of about 10 nm and composed of a single-layer film of titanium is deposited over the entire surface by sputtering, on which is further deposited a second metal film 7a having a thickness of about 600 nm and composed of an alloy of aluminum containing about 1% of silicon and about 0.5% of copper. It should be noted that titanium nitride or the like may be formed as an anti reflection layer (not shown) on the second metal film 7a, depending on the case. The anti reflection layer is for preventing, in the process of exposing a photoresist film, the photoresist film from being processed in improper size under the influence of light reflected from the surface of the alloy of aluminum.

Figure 1C:
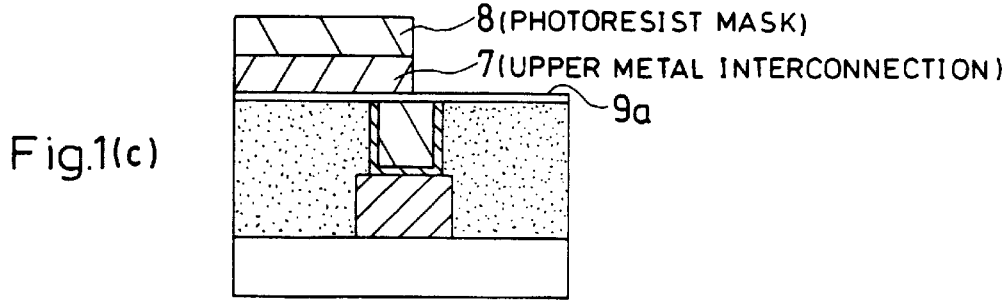

Next, in the process step shown in FIG. 1(c), the photoresist film is applied, which is then patterned and exposed to form a photoresist mask 8 having a pattern for forming a metal interconnection to be connected to the W plug 6. Although the photoresist mask 8 has originally been designed to cover up the W plug 6 or the connection hole 4, the provision of no alignment margin for the mask used in forming the connection hole 4 increases the probability that the photoresist mask 8 does not cover the connection hole 4 completely. FIG. 1(c) shows the case where the edge portion of the photoresist mask 8 has been formed over the connection hole 4 due to a displacement of the above masks. The displacement was caused in the course of selectively removing the second metal film 7a corresponding to the opening by using the photoresist mask 8 so as to form an upper metal interconnection 7. Dry etching is performed by using the photoresist mask 8 and a mixture gas of, e.g., chlorine gas and nitrogen gas so as to selectively remove the second metal film 7a composed of an alloy film of aluminum located below the opening of the photoresist mask 8. During the process, the first metal film 9b is not removed by the mixture gas of chlorine and nitrogen so that the surface of the first metal film 9b is exposed in the opening of the photoresist mask 8.

Figure 1D:
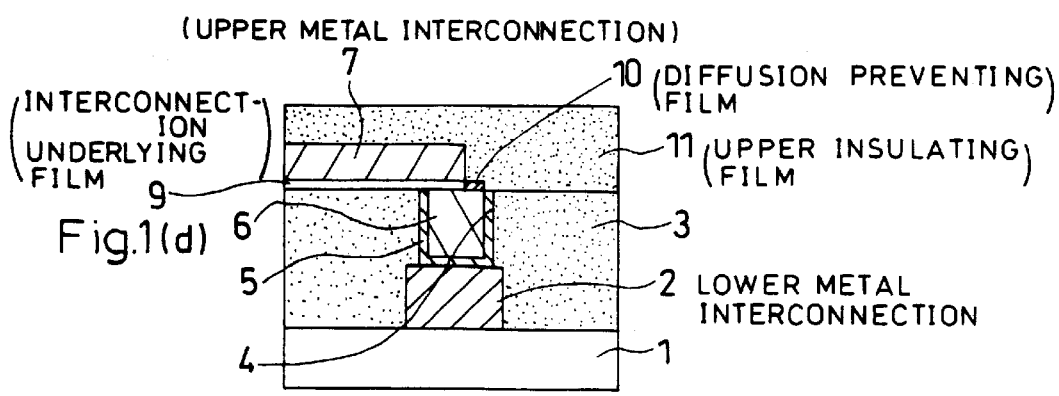

Thereafter, in the process step shown in FIG. 1(d), the etchant species for dry etching is switched from the gas used in removing the second metal film 7a to, e.g., sulfur hexafluoride ($SF_6$) gas. Then, dry etching is performed using the $SF_6$ gas so as to remove the first metal film 9b composed of the titanium film which has been exposed in the opening of the photoresist mask 8. During the process, the substrate is set to an appropriate temperature equal to or lower than 100° C. By performing dry etching under the foregoing condition, the titanium film is removed, while the diffusion preventing film 10 made of titanium fluoride is simultaneously formed over the W plug 6.

Briefly, the reaction occurs between titanium and fluorine when the first metal film 9b composed of the titanium film is removed by the $SF_6$ gas and, as soon as the surface of the W plug 6 is partially exposed, the reaction product begins to be deposited thereon. An example of the conditions for etching using the $SF_6$ gas and selective deposition is shown in the following Table 1.

TABLE 1

| RF power | pressure | substrate temperature | $SF_6$ flow rate | $N_2$ flow rate |
|---|---|---|---|---|
| 150 W | 120 mtorr | 80° C. | 80 sccm | 40 sccm |

Subsequently, the photoresist mask 8 is removed and the upper insulating film 11 is deposited, followed by a thermal treatment for restoring the damage caused by dry etching in a thermal treatment furnace (not shown).

By the above method, the structure of the semiconductor device shown in FIG. 1(d) is eventually obtained. In the structure, the lower metal interconnection 2 is provided on the substrate 1, the interlayer insulating film 3 is formed over the substrate 1 and the lower metal interconnection 3, and the upper metal interconnection 7 is formed from the portion of the second metal film 7a left thereon. In the connection hole 4 formed by partially opening the interlayer insulating film 3 and leading to the lower metal interconnection 2 has been filled the W plug 6 via the plug underlying film 5 formed from the remaining part of the TiN/Ti film. Over the W plug 6 has been formed the upper metal interconnection 7 via the interconnection underlying film 9 formed from the remaining portion of the first metal film 9b.

As described above, since the photoresist mask 8 for forming the upper metal interconnection 7 is provided with no alignment margin for the photoresist mask used in forming the connection hole, the upper metal interconnection 7 rarely covers up all the connection holes 4 or W plugs 6 completely. On the contrary, the W plugs 6 have been partially exposed in most connection holes 4 prior to the formation of the upper insulating film 11, as shown in FIG. 1(d). Accordingly, as the alignment margin is reduced, the probability that the metal interconnection does not cover the upper surface of the W plug 6 completely is increased. After the upper insulating film 11 has been formed, if the thermal treatment for damage restoration is performed, respective constituent atoms of the upper insulating film 11 and interconnection underlying film 9 (aluminum atoms and tungsten atoms in the present embodiment) are reciprocally diffused through the interface therebetween, so that an alloy layer having high electric resistivity may be formed disadvantageously. In the present embodiment, however, since the diffusion preventing film 10 made of a titanium fluoride is formed over the exposed part of the W plug 6 prior to the formation of the upper insulating film 11, the aluminum atoms and tungsten atoms are prevented from being diffused into the W plug 6 and upper metal interconnection 7, respectively, in the subsequent thermal treatment process, which effectively prevents the formation of the alloy ($WAl_{12}$) having high electric resistivity. Consequently, it becomes possible to achieve a high degree of integration by using a mask with no alignment margin, while effectively preventing the lowering of reliability.

It will be appreciated that the present invention is also applicable not only to the manufacturing method involving no alignment margin but also to the case where a small alignment margin causes a shift in position of the W plug from the upper metal interconnection.

Figure 5:
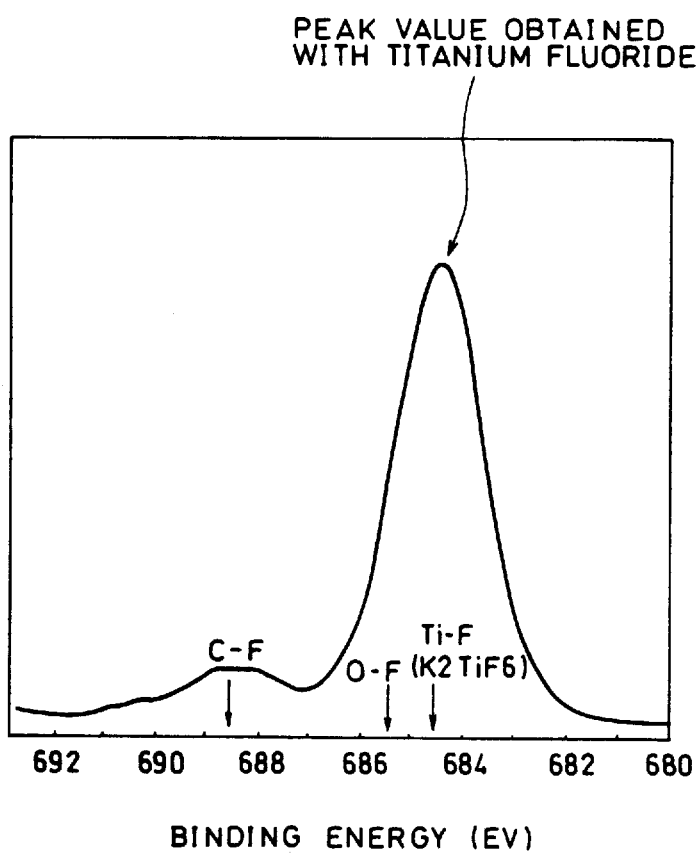
FIG. 5 is a view showing the result of ESCA which indicates the formation of a titanium fluoride in the first to fourth embodiments.

FIG. 5 shows the intensity spectrum as a result of electron spectroscopy for chemical analysis (ESCA) performed to confirm the formation of titanium fluoride films in the present embodiment and other individual embodiments to be described below. The drawing shows the result of analysis in the case of using $SF_6$ gas as fluorine-containing gas. From the drawing, it has been confirmed that the titanium fluoride films have been formed on the surfaces of the W plugs 6.

Although the present embodiment has used the blanket tungsten CVD and etch back in order to form the W plug 6 in the connection hole 4, selective tungsten CVD may be used instead whereby a tungsten film is selectively deposited on the lower metal interconnection 2 exposed in the connection holes 4 without depositing the tungsten film on the interlayer insulating film 3. The same shall apply to the other embodiments described later.

Although the present embodiment has described the case where the connection hole 4 is a via hole which connects the lower metal interconnection 2 to the upper metal interconnection 7, it will be appreciated that the same effect can also be obtained in the case where the connection hole 4 is a contact hole which connects the semiconductor region to the metal interconnection. Accordingly, the conductive layer underlying the interlayer insulating film 3 is not limited to the metal interconnection in the present embodiment and other individual embodiments to be described below. It may be source/drain regions on the semiconductor substrate.

Although the first metal film 9b formed into the interconnection underlying film is composed of the single-layer titanium film in the present embodiment, it may be composed of a multilayer film consisting of, e.g., a titanium layer and a titanium nitride layer. It is particularly preferable to compose the first metal film 9b of a material containing titanium with a view to ensuring the formation of a fluoride film. The same shall apply to the other embodiments described later.

Although the titanium fluoride film as the diffusion preventing film 10 is formed simultaneously with the removal of a part of the first metal film 9b by using the same etchant gas in the present embodiment, the present invention is not limited to such an embodiment. Specifically, the diffusion preventing film 10 is not limited to the titanium fluoride film but may be composed of a fluoride film of another metal. The diffusion preventing film 10 is not limited to a fluoride film but may be composed of, e.g., a nitride film or a silicide film.

Furthermore, it is not necessarily required to form the diffusion preventing film 10 by using the same gas as used in etching the first metal film 9b. For example, it is also possible to pattern the second metal film 7a and the first metal film 9b at the same time and then cover the exposed W plug 6 with the diffusion preventing film 10 formed by selective CVD or like method.

However, the present embodiment offers the advantage of simplified process by leaving the first metal film 9b in patterning the second metal film 7a into the upper metal interconnection 7 and forming the diffusion preventing film 10 while removing the first metal film 9b. Although the present embodiment has used the $SF_6$ gas for forming the titanium fluoride film and simultaneously removing a part of the first metal film 9b, $CF_4$ gas, $CHF_3$ gas, or $NF_3$ gas may be used instead. The same shall apply to the other individual embodiments described later.

Although the upper metal interconnection 7 is composed of the alloy of aluminum containing silicon and copper in the present embodiment, it may also be composed another alloy of aluminum containing only silicon or another metal such as scandium. Alternatively, the upper metal interconnection 7 may be composed of pure aluminum. The same shall apply to the other individual embodiments described later.

Although the first metal film 9b is composed of the titanium film in the present embodiment, it may also be composed of an alloy film of titanium and tungsten, a tungsten film, a tungsten silicide film, or the like.

(Second Embodiment)

Next, a description will be given to a second embodiment with reference to FIGS. 2(a) to 2(d), which are cross-sectional views illustrating the process of manufacturing a semiconductor device according to the second embodiment. In the present embodiment, the interconnection underlying film is composed of a double-layer film consisting of a titanium nitride film and a titanium film.

Figure 2A:
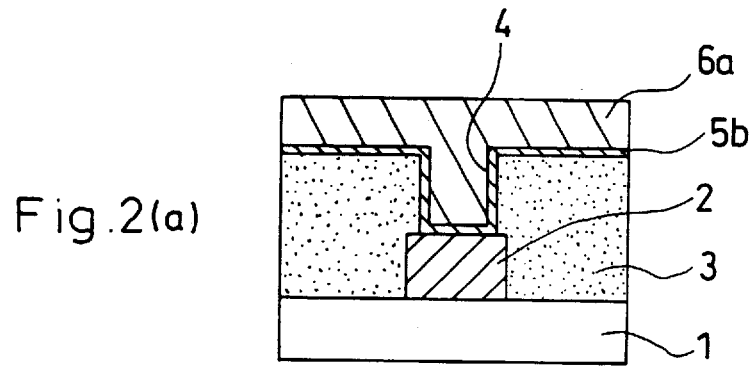
FIGS. 2(a) to 2(d) are cross-sectional views illustrating the process of manufacturing a semiconductor device according to a second embodiment.

Since FIG. 2(a) shows the same structure as shown in FIG. 1(a) of the above first embodiment, the description thereof is omitted here. In the present embodiment, however, a third metal film 5b composed of a single-layer titanium film is deposited not only on the side and bottom faces of the connection hole 4 but also on the interlayer insulating film 3, so that the tungsten film 6a is deposited on the third metal film 5b which has been left over the entire surface. Afterwards, the third metal film 5b will be partially used as an interconnection underlying metal film.

Figure 2B:
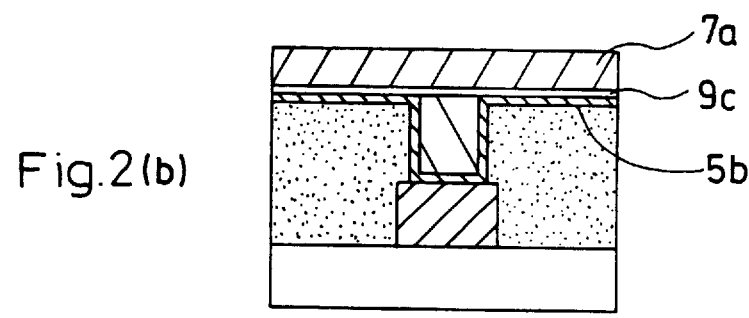

Next, as shown in FIG. 2(b), the tungsten film 6a except for the portion lying inside the connection hole 4 is evenly removed by dry etching, thereby forming the W plug 6 in the connection hole 4. However, the present embodiment is different from the above first embodiment in that the third metal film 5b is not removed but left over the entire surface. Then, a first metal film 9c having a thickness of about 50 nm and the second metal film 7a having a thickness of about 600 nm and composed of an alloy of aluminum containing about 1% of silicon and about 0.5% of copper are sequentially formed by sputtering over the entire surface. There may be the case where a titanium nitride film with a thickness of several tens of nanometers is formed as the anti reflection layer on the second metal film 7a.

Figure 2C:
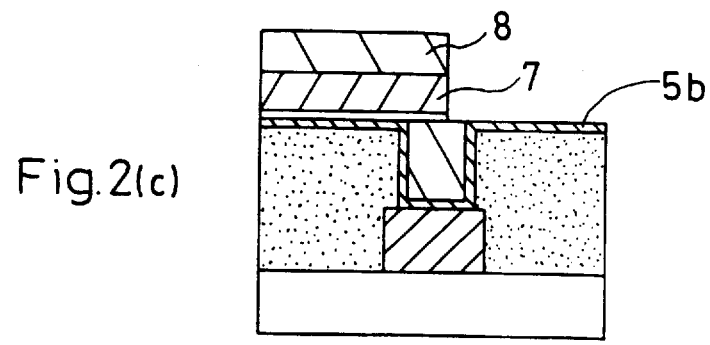

Next, as shown in FIG. 2(c), the photoresist mask 8 provided with no alignment margin for the mask used in forming the connection hole 4 is formed. During the process, the probability that the photoresist mask 8 does not cover the W plug 6 completely, as shown in the drawing, remains high, similarly to the above first embodiment. Dry etching is performed using the photoresist mask 8 and a mixture gas of, e.g., chlorine gas and nitrogen gas, thereby partially removing the second metal film 7a and the first metal film 9c so as to form the metal interconnection 7. On the other hand, the third metal film 5b is not removed. At this stage, the surface of that part of the W plug 6 which is uncovered by the photoresist mask 8, i.e., uncovered by the metal interconnection 7 becomes exposed.

Figure 2D:
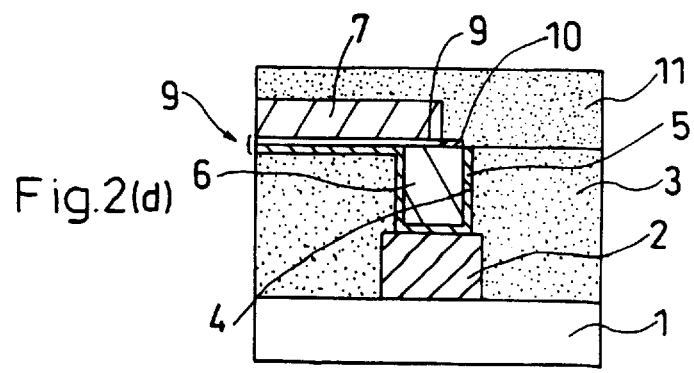

Thereafter, in the process step shown in FIG. 2(d), dry etching is performed using, e.g., sulfur hexafluoride ($SF_6$) with the photoresist mask 8 left as it is, thereby removing the titanium film composing the third metal film 5b, while forming the diffusion preventing film 10 made of a titanium fluoride in the portion in which the W plug 6 has been exposed. At that time, if the substrate is set to an appropriate temperature equal to or lower than 100° C., the titanium film composing the third metal film 5b is removed from above the interlayer insulating film, while the titanium fluoride is formed on the surface of the W plug 6 simultaneously with the removal of the titanium film from above the W plug 6. An example of the etching conditions using the $SF_6$ gas has been shown in Table 1 of the above first embodiment. That portion of the third metal film 5b remaining on the interlayer insulating film 3 at the completion of dry etching process and the remaining portion of the first metal film 9c compose the interconnection underlying film 9. That portion of the remaining third metal film 5b which has been deposited in the connection hole 4 forms the plug underlying film 5 for improving the adhesion of the W plug 6.

After that, the photoresist mask 8 is removed and the upper insulating film 11 is deposited, followed by a thermal treatment for damage restoration or the like in the thermal treatment furnace.

Since the diffusion preventing film 10 has been formed over that part of the W plug 6 uncovered with the metal interconnection 7 or the like, the same effect as obtained in the above first embodiment can also be obtained in the present embodiment. In particular, the present embodiment utilizes the third metal film 5b as a part of the interconnection underlying film 9 as well. Briefly, since the interconnection underlying film 9 is a multilayer film consisting of the remaining portion of the first metal film 9c and that portion of the third metal film 5b remaining on the interlayer insulating film 3, the present embodiment achieves the effects of reducing the electric resistivity of the metal interconnection and preventing electromigration by properly selecting and combining the materials of the multilayer film, in addition to the effect achieved in the above first embodiment.

Although the present embodiment has composed the third metal film 5b of a single-layer film of titanium, it is also possible to form, e.g., another metal film on or beneath the titanium film and perform dry etching using the $SF_6$ gas, thereby etching away the metal layer prior to or after the formation of the titanium fluoride film over the W plug 6.

Although the present embodiment has composed the first metal film 9c of the titanium nitride film, it is also possible to compose the first metal film 9c of an alloy film of titanium and tungsten, a tungsten film, or a tungsten silicide film.

(Third Embodiment)

Below, a description will be given to a third embodiment with reference to FIGS. 3(a) to 3(d).

FIGS. 3(a) to 3(d) are cross-sectional views illustrating the process of manufacturing a semiconductor device according to the third embodiment. In the present embodiment, the interconnection underlying film is composed of a multilayer film consisting of a titanium film and a titanium nitride film with the provision of no plug underlying film.

Figure 3A:
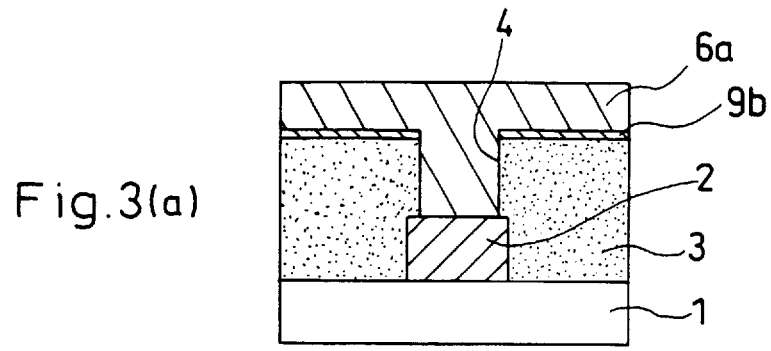
FIGS. 3(a) to 3(d) are cross-sectional views illustrating the process of manufacturing a semiconductor device according to a third embodiment.

In the process step shown in FIG. 3(a), after the interlayer insulating film 3 is formed, the first metal film 9b composed of a titanium film is deposited on the interlayer insulating film 3 to a thickness of several tens of nanometers, followed by the formation of the connection hole 4 by partially opening the interlayer insulating film 3 and the first metal film 9b. Subsequently, a tungsten film 6a is deposited so as to fill in the connection hole 4 and cover the first metal film 9b.

Figure 3B:
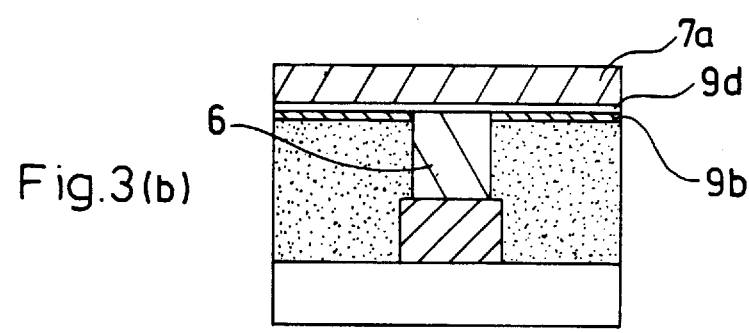

Next, as shown in FIG. 3(b), a fourth metal film 9d having a thickness of about 50 nm and composed of a titanium nitride film and the second metal film 7a having a thickness of about 600 nm and composed of an alloy film of aluminum containing about 1% of silicon and about 0.5% of copper are sequentially formed on the substrate.

Figure 3C:
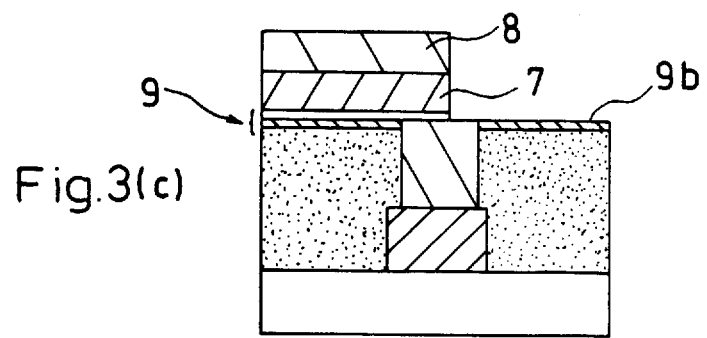
Figure 3D:
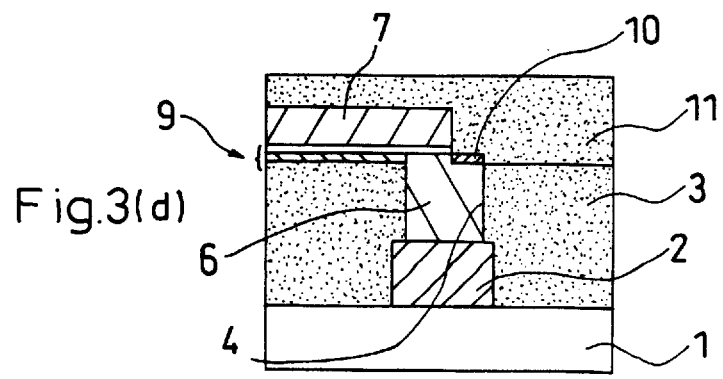

Thereafter, the same process steps as shown in FIGS. 2(c) and 2(d) of the above second embodiment are performed in the process steps shown in FIGS. 3(c) and 3(d).

As a result of performing the above process steps, the interconnection underlying film 9 of the present embodiment is composed of the remaining portion of the second metal film 9b and the remaining portion of the fourth metal film 9d. Briefly, the interconnection underlying film 9 is composed of a multilayer film consisting of the titanium film and the titanium nitride film formed thereon, similarly to the above second embodiment. The present embodiment is different from the above second embodiment in that no plug underlying film has been formed.

The semiconductor device formed through the process of the present embodiment also achieves the same effects as achieved in the above first and second embodiments. Specifically, since the photoresist mask has been formed with no alignment margin for the mask used in forming the connection hole 4, even when the W plug 6 has a part uncovered with the upper metal interconnection 7, the diffusion preventing film 10 is formed over the uncovered part, which effectively prevents the formation of the alloy layer having high electric resistivity resulting from the diffusion of aluminum atoms into the W plug 6 and the diffusion of tungsten atoms into the upper metal interconnection 7 in the subsequent thermal treatment process, resulting in improved reliability.

(Fourth Embodiment)

Below, a description will be given to a fourth embodiment with reference to FIG. 4, which is a cross-sectional view showing the structure of a semiconductor device according to the fourth embodiment.

Figure 4:
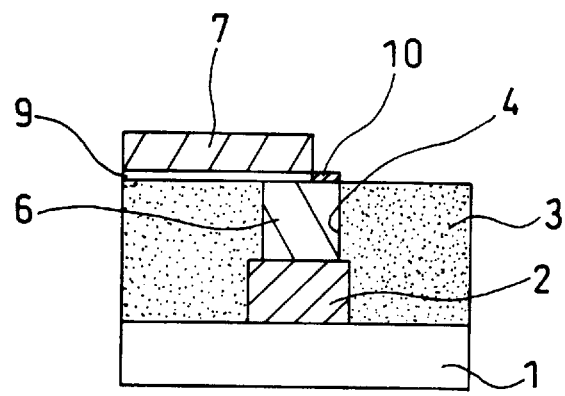
FIG. 4 is a cross-sectional view showing the structure of a semiconductor device according to a fourth embodiment.

As shown in FIG. 4, the semiconductor device according to the present embodiment comprises: the substrate 1 on which transistors and the like have been formed; the lower metal interconnection 2 formed on a part of the substrate 1; the interlayer insulating film 3 deposited over the substrate 1 and lower metal interconnection 2; the W plug 6 filled in the connection hole 4 formed by opening a part of the interlayer insulating film 3; the interconnection underlying film 9 formed over the interlayer insulating film 3 and W plug 6; and an upper metal interconnection 7 formed thereon. However, since the photoresist mask has been formed with no alignment margin for the mask used in forming the connection hole 4, FIG. 4 shows a cross section of the W plug 6 having its upper surface not completely covered with the upper metal interconnection 7. FIG. 4 shows the structure formed through such a process as will be described below. After the upper metal interconnection 2 and interlayer insulating film 3 have been formed on the substrate 1, the connection hole 4 is formed and the W plug 6 is formed in the connection hole 4 by selective tungsten CVD. Subsequently, the first metal film 9 composed of a titanium film and the second metal film composed of an alloy film of aluminum are sequentially deposited, followed by the formation of the upper metal interconnection 7. Thereafter, the first metal film is further etched away. At that time, the surface of the titanium film composing the first metal film and the surface of the W plug 6 are simultaneously processed with the $SF_6$ gas changed into a plasma, thereby forming the diffusion preventing film 10 made of a titanium fluoride on the surface of the W plug 6, while removing the first metal film 9.

In the present embodiment also, since the diffusion preventing film 10 made of the titanium fluoride has been formed on that part of the W plug 6 uncovered with the metal interconnection 7, the formation of the alloy layer having high electric resistivity resulting from the diffusion of aluminum atoms into the W plug 6 and the diffusion of tungsten atoms into the upper metal interconnection 7 can effectively be prevented in the subsequent thermal treatment process.

Moreover, since the present embodiment has used selective tungsten CVD as the method of filling tungsten in the connection hole, only tungsten is filled in the connection hole. However, the same effect as achieved in the present embodiment can also be achieved in the case of using blanket tungsten CVD and etch back, though a refractory metal such as titanium nitride deposited as the plug underlying layer is left in the connection hole.

(Fifth Embodiment)

Next, a description will be given to a fifth embodiment with reference to FIGS. 6(a) to 6(d), which are cross-sectional views illustrating the process of manufacturing a semiconductor device according to the fifth embodiment.

Figure 6A:
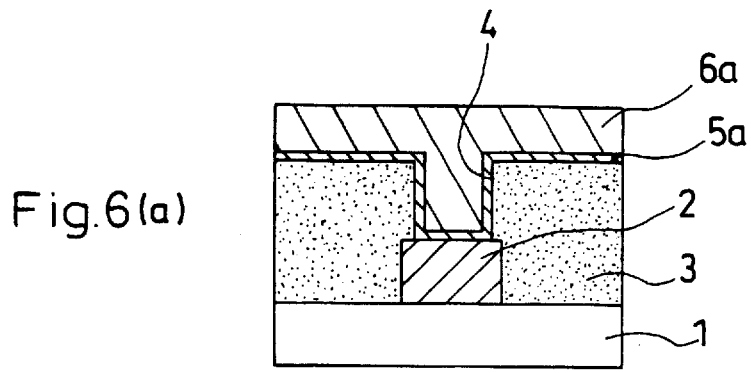
FIGS. 6(a) to 6(d) are cross-sectional views illustrating the process of manufacturing a semiconductor device according to a fifth embodiment.
Figure 6B:
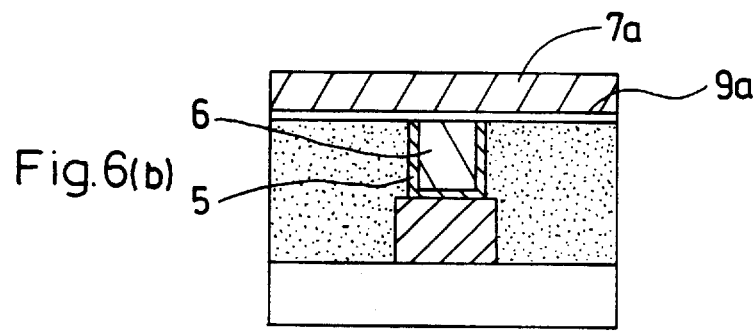
Figure 6C:
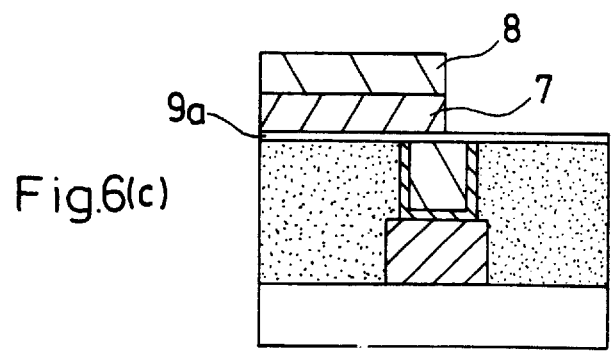
Figure 6D:
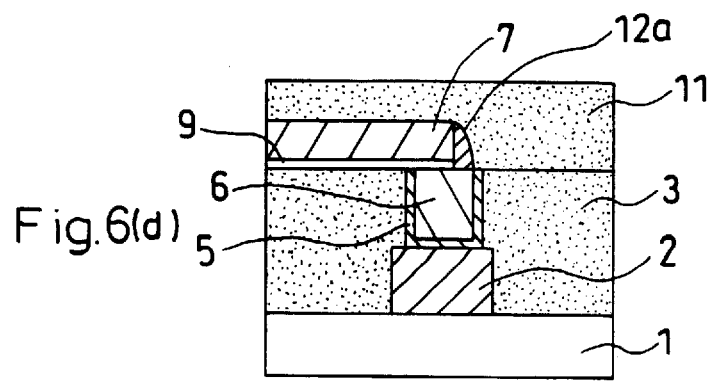
Figure 15A:
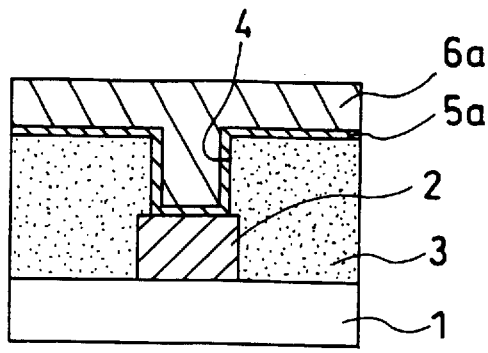
FIGS. 15(a) to 15(d) are cross-sectional views illustrating the process of manufacturing a semiconductor device according to a conventional embodiment.
Figure 15B:
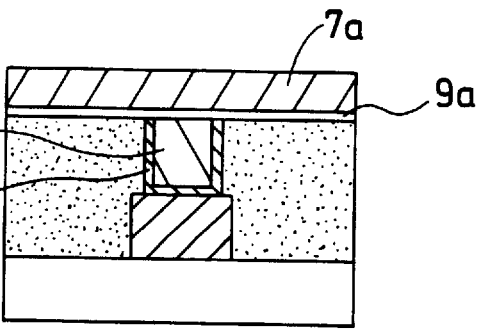
Figure 15C:
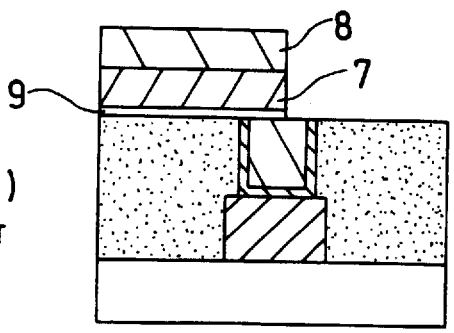
Figure 15D:
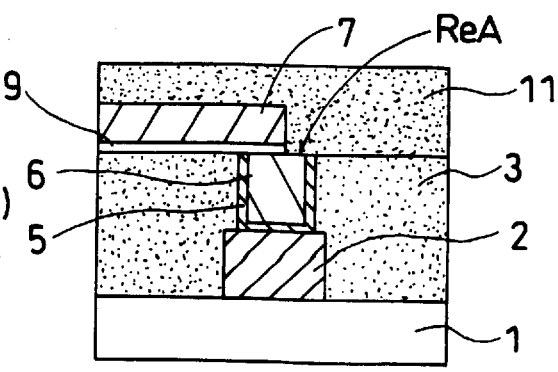
Figure 16A:
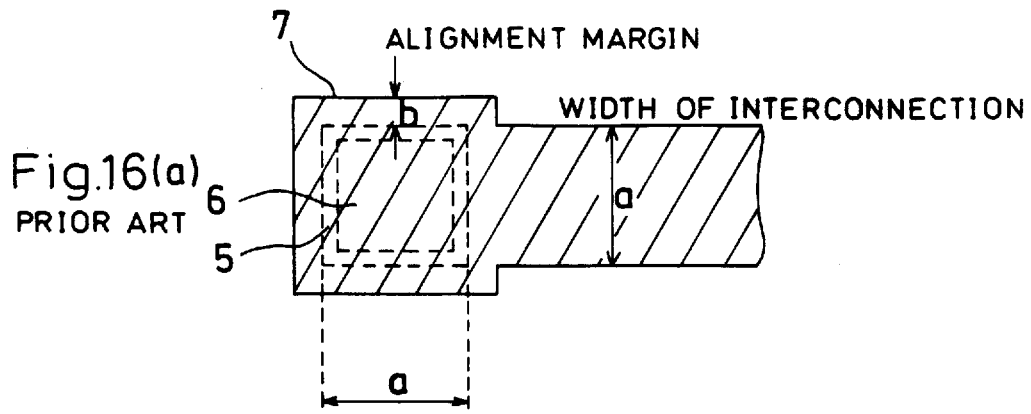
FIGS. 16(a) and 16(b) are plan views showing for comparison the overlapping of the metal interconnection and the W plug with an alignment margin and the overlapping of the metal interconnection and the W plug with no alignment margin, each according to the conventional embodiment.
Figure 16B:
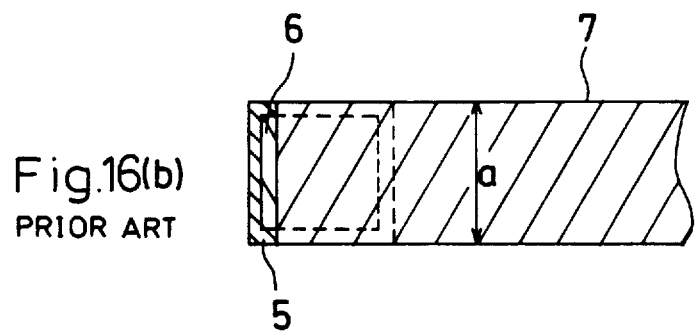

Initially, the same process steps as shown in FIGS. 15(a) to 15(c) of the above conventional embodiment are performed in the process steps shown in FIGS. 6(a) to 6(c). Specifically, after the W plug 6 is filled in the connection hole 4 via the plug underlying film 5 composed of a TiN/Ti film, the first metal film 9a composed of a TiN/Ti film and the second metal film 7a made of an alloy of aluminum are deposited over the entire surface of the substrate, followed by the formation of the photoresist mask 8 on the second metal film 9a. Then, the second metal film 7a and the first metal film 9a are etched using the photoresist mask 8 so as to form the metal interconnection 7 and the interconnection underlying film 9, respectively. At that time, since no alignment margin or only a small alignment margin is provided similarly to the above individual embodiments, the metal interconnection 7 does not cover the W plug 6 completely, as shown in FIG. 6(c).

Next, after the photoresist mask 8 has been removed, a silicon nitride film is deposited comparatively thick over the upper metal interconnection 7, the exposed part of the W plug 6, and the interlayer insulating film 3. The silicon nitride film is then partially removed by anisotropic etching, thereby leaving sidewalls 12a on the side faces of the upper metal interconnection 7 and interconnection underlying film 9.

Thereafter, the upper insulating film 11 is deposited over the upper metal interconnection 7, sidewalls 12, and interlayer insulating film 3, followed by a thermal treatment for damage restoration.

In the present embodiment, since the sidewalls 12 prevent the aluminum atoms and tungsten atoms from being diffused into the W plug 6 and into the upper metal interconnection 7, respectively, the same effect as obtained in the above individual embodiments can be obtained. In the present embodiment, it is not necessary to form sidewalls which entirely cover the exposed surface of the W plug 6. If the sidewalls 12 are formed at least over the corner portion at which the upper metal interconnection 7 is closest to the W plug, the above reciprocal diffusion can be prevented.

(Sixth Embodiment)

Below, a description will be given to a sixth embodiment with reference to FIGS. 7(a) to 7(d) and FIG. 8.

Figure 7A:
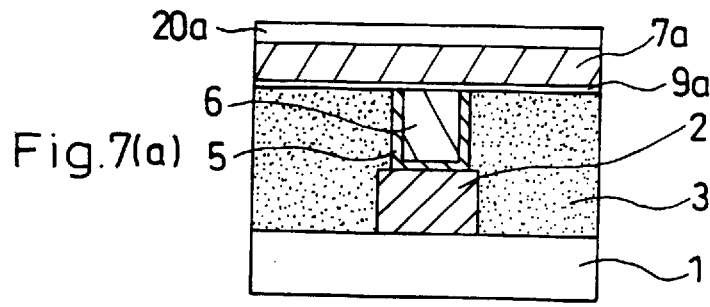
FIGS. 7(a) to 7(d) are cross-sectional views illustrating the process of manufacturing a semiconductor device according to a sixth embodiment.

Initially, the same process steps as shown in FIGS. 15(a) and 15(b) of the above conventional embodiment are performed in the process steps shown in FIG. 7(a). Specifically, the W plug 6 is filled in the connection hole via the plug underlying film 5 composed of a TiN/Ti film, followed by the deposition of the first metal film 9a composed of a TiN/Ti film and the second metal film 7a made of an alloy of aluminum over the entire surface of the substrate. In the present embodiment, a silicon dioxide film 20a is further deposited on the second metal film 7a so as to serve as a protective film during etch back.

Figure 7B:
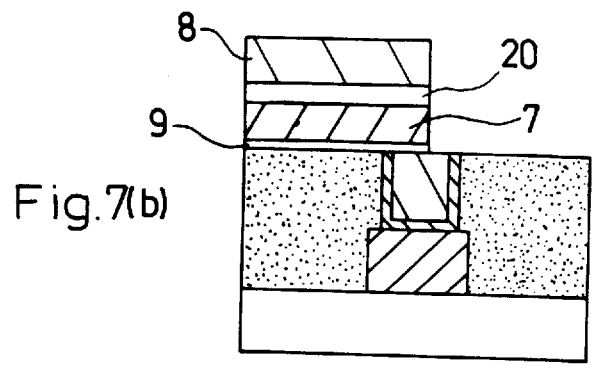

Next, as shown in FIG. 7(b), after a photoresist mask 8 is formed on the silicon dioxide film 20a, the silicon dioxide film 20a, the second metal film 7a, and the first metal film 9a are etched using the photoresist mask 8 so as to form a protective film 20, the metal interconnection 7, and the interconnection underlying film 9, respectively. At that time, since no alignment margin or only a small alignment margin is provided similarly to the above individual embodiments, the metal interconnection 7 does not cover the W plug 6 completely, as shown in FIG. 7(b).

Figure 7C:
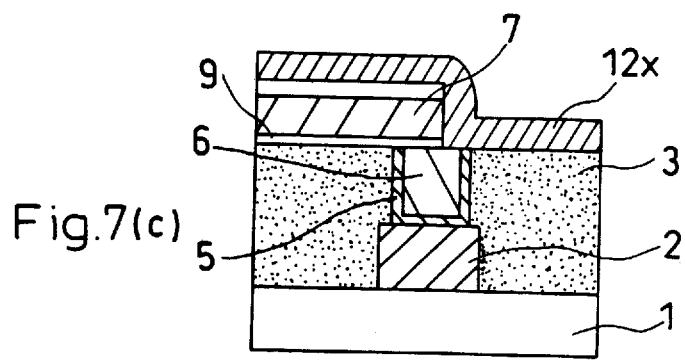

Next, as shown in FIG. 7(c), the photoresist mask 8 is removed by ashing or the like, followed by the deposition of a comparatively thick titanium film 12x over the entire surface of the substrate.

Figure 7D:
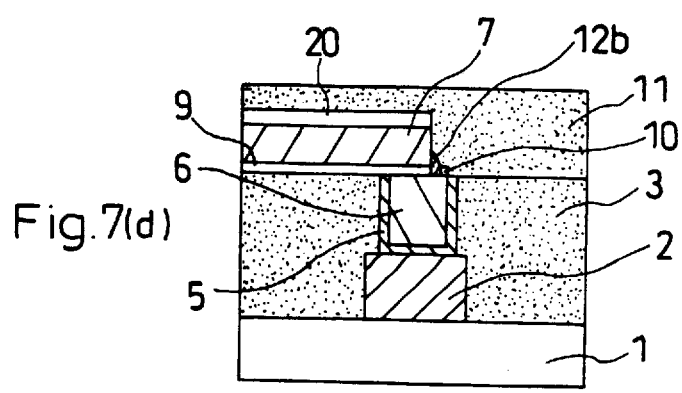

Next, as shown in FIG. 7(d), the titanium film 12x is etched back using $Cl_2$—$N_2$ gas, $CHCl_3$ gas, or the like, thereby leaving the sidewalls 12b composed of the titanium film on the corner portion between the metal interconnection 7 and the W plug 6. At this time, since the etching selectivity of the titanium film 12x to the silicon dioxide film can sufficiently be increased, the protective film 20 and the interlayer insulating film 3 are not excessively removed. The etching gas is switched to $SF_6$ gas specified time before the completion of overetching so as to perform dry etching under the conditions shown in the above Table 1, thereby forming the diffusion preventing film 10 made of a titanium fluoride over the exposed part of the W plug 7. Thereafter, the upper insulating film 11 is deposited over the entire surface of the substrate.

Figure 8:
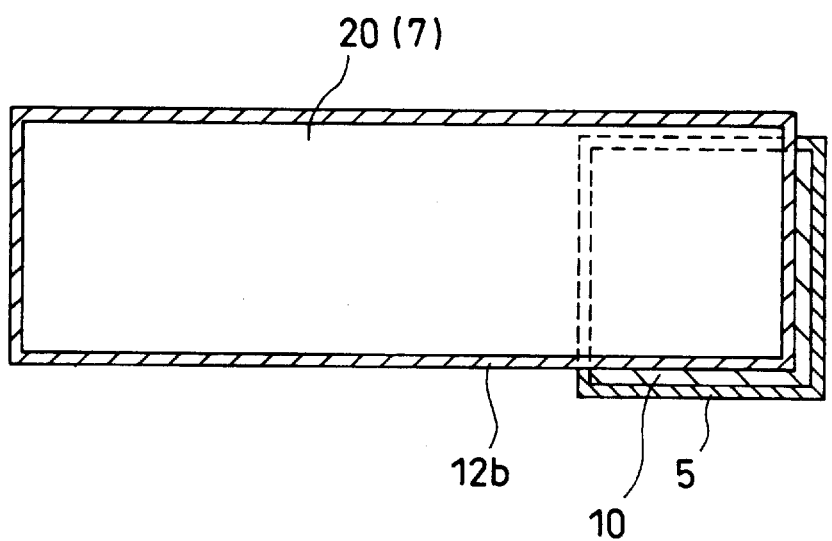
FIG. 8 is a plan view showing the overlapping of a metal interconnection and a W plug in the semiconductor device according to the sixth embodiment.

FIG. 8 is a plan view showing the overlapping of the metal interconnection 7 and the W plug 6 in the present embodiment. Although the conductive sidewalls 12b are formed to surround the metal interconnection 7, as shown in the drawing, since the sidewalls 12b have been formed by self alignment, such a problem as the interference of the sidewalls 12b with another W plug does not arise. However, if the width of the sidewall 12b is excessively large, the same result as achieved by a large alignment margin is consequently achieved, so that it is preferable to perform overetching so as to reduce the width of the sidewall 12b.

In the present embodiment also, since the sidewalls 12b composed of the titanium film which reacts with the W plug 7 and does not form a high-resistance compound have been formed over the corner portion at which the metal interconnection 7 is closest to the W plug 6, the formation of a high-resistance compound resulting from the reciprocal diffusion of the aluminum atoms and tungsten atoms can be prevented, thus achieving the same effect as achieved in the above fifth embodiment. Moreover, since the diffusion preventing film 10 made of a titanium fluoride is formed over that part of the W plug 6 which has not been covered either with the metal interconnection 7 or with the sidewalls 12b, the reciprocal diffusion of the aluminum atoms and tungsten atoms can be prevented more effectively. Furthermore, the present embodiment is also advantageous in that the sidewalls 12b allow an electric current to flow therethrough.

(Seventh Embodiment)

Below, a description will be given with seventh embodiment with reference to FIGS. 9(a) to 9(d), which are cross-sectional views illustrating the process of manufacturing a semiconductor device of the seventh embodiment.

Figure 9A:
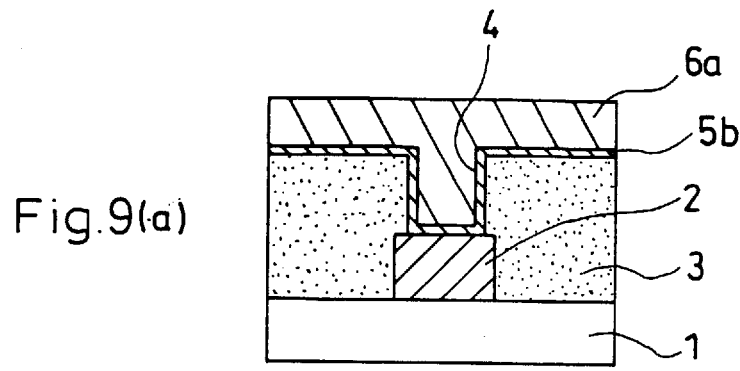
FIGS. 9(a) to 9(d) are cross-sectional views illustrating the process of manufacturing a semiconductor device according to a seventh embodiment.
Figure 9B:
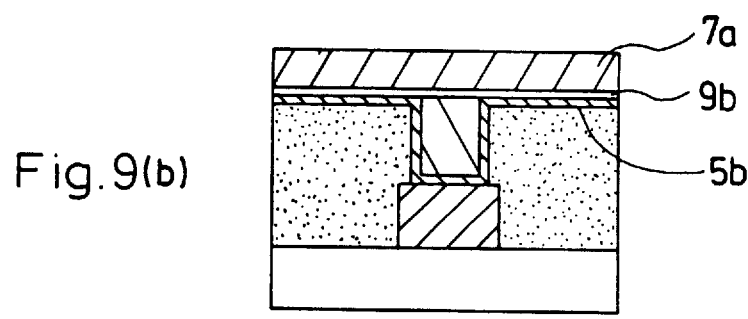

Initially, the same process steps as shown in FIGS. 15(a) and 15(b) of the above conventional embodiment are performed in the process steps shown in FIGS. 9(a) and 9(b).

Figure 9C:
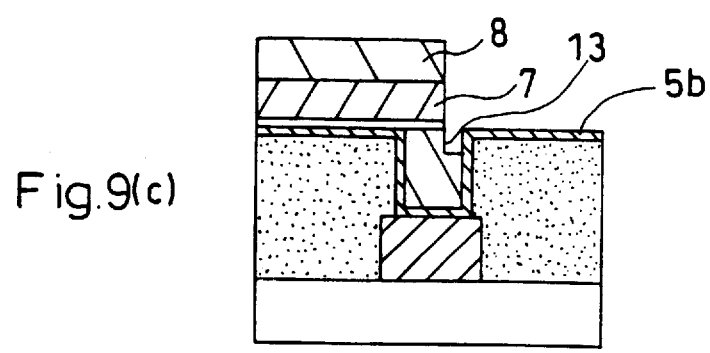

Next, as shown in FIG. 9(c), the interconnection underlying metal film 9b is selectively etched using the photoresist mask 8 so as not to remove the plug underlying metal film 5b from above the interlayer insulating film 3 but leave it as it is. At this stage, dry etching is performed with respect to the exposed part of the W plug 6 using the photoresist mask 8 as it is and, e.g., the $SF_6$ gas, thereby forming a recessed portion 13 having a specified depth in the W plug 6. The dry etching may also be performed at a comparatively low temperature by using, e.g., the $SF_6$ gas. If the dry etching is performed for about 1 minute under the conditions of Table 1, for example, the depth of the recessed portion in the W plug 6 formed by the etching becomes about 100 nm. During the process, since the etching selectivity of the W plug 6 to the plug underlying metal film 5b composed of the titanium film can sufficiently be increased, the plug underlying metal film 5b covering the interlayer insulating film 3 functions to prevent the interlayer insulating film 3 from being etched. Subsequently, the plug underlying metal film 5b is patterned using the same photoresist mask and the upper insulating film 11 is deposited over the interlayer insulating film 3 and upper metal interconnection 7 having their surfaces exposed, followed by a thermal treatment.

In the present embodiment, since the recessed portion 13 has been formed in the portion at which the upper metal interconnection 7 and the W plug 6 are contiguous to each other, the W plug 6 is kept away from the upper metal interconnection 7 made of the alloy of aluminum with no contact therebetween. Consequently, there can be prevented the formation of the alloy of tungsten and aluminum ($WAl_{12}$) resulting from the diffusion of aluminum atoms into the W plug 6 and the diffusion of the tungsten atoms into the upper metal interconnection 7 even when the thermal treatment is performed. Hence, the same effect as obtained in the above individual embodiments can be obtained.

(Eighth Embodiment)

Below, a description will be given to an eighth embodiment with reference to FIG. 10, which is a cross-sectional view showing the structure of a semiconductor device according to the eighth embodiment.

Figure 9D:
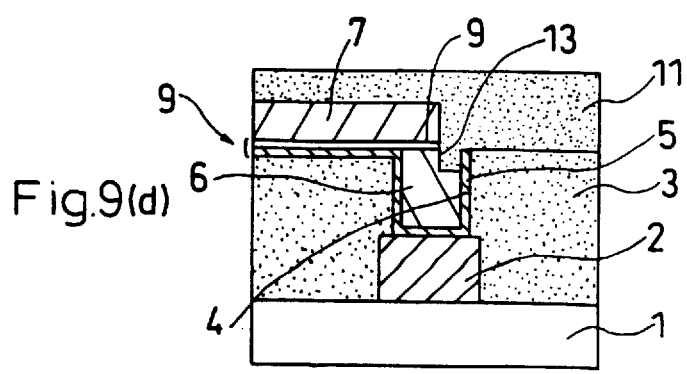

The structure of the semiconductor device in the present embodiment is basically the same as that of the semiconductor device shown in the above seventh embodiment, except that the interconnection underlying film 9 composed of the remaining portions of the first and second interconnection underlying films, instead of the W plug underlying film 5 shown in FIG. 9(d), is formed in the present embodiment.

Figure 10:
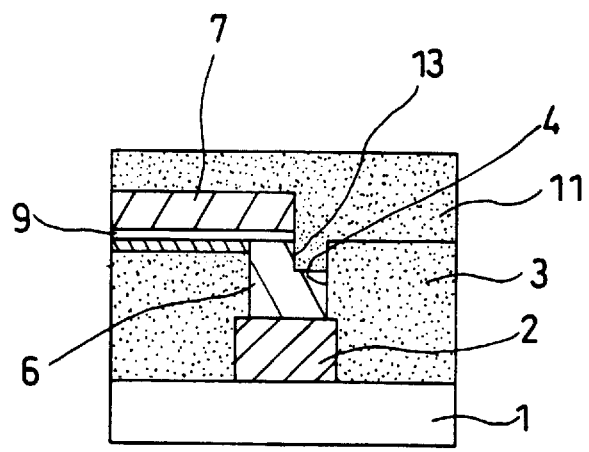
FIG. 10 is a cross-sectional view showing the structure of a semiconductor device according to an eighth embodiment.

The structure of the semiconductor device shown in FIG. 10 is implemented through such a process as will be described below. After the lower metal interconnection 2 and the interlayer insulating film 3 are formed on the substrate 1, the connection hole 4 is formed, followed by the formation of the W plug 6 in the connection hole 4 by selective tungsten CVD. Thereafter, a titanium film and a titanium nitride film are deposited to form the interconnection underlying film, followed by the deposition of the second metal film. Subsequently, etching is performed using the photoresist mask so as to pattern the respective metal films into the interconnection underlying film 9 and the upper metal interconnection 7. Then, that part of the W plug 6 having its surface exposed in the connection hole 4 is etched using the photoresist mask as it is and the $SF_6$ gas, thereby forming the recessed portion 13 in the W plug 6. After that, the upper insulating film 11 is deposited, followed by a thermal treatment.

It will be appreciated that the same effect as obtained in the above seventh embodiment can also be obtained in the present embodiment.

(Ninth Embodiment)

Below, a description will be given to a ninth embodiment with reference to FIG. 11, which is a cross-sectional view of a semiconductor device according to the present embodiment.

Figure 11:
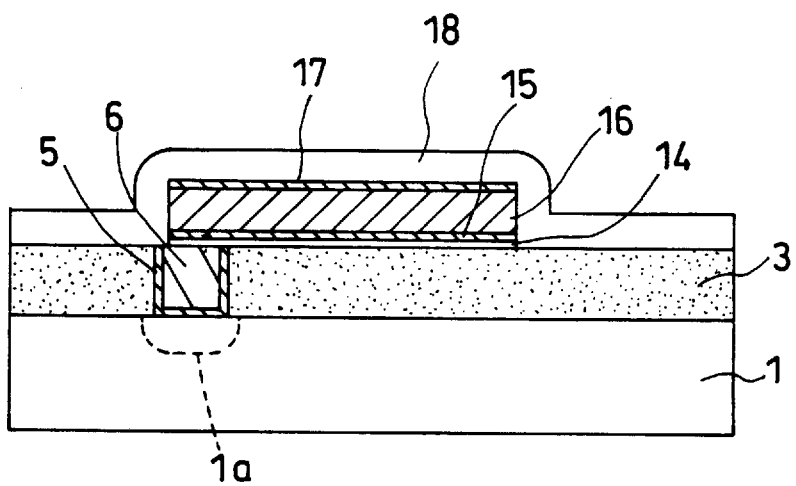
FIG. 11 is a cross-sectional view showing the structure of a semiconductor device according to a ninth embodiment.

As shown in FIG. 11, the semiconductor device according to the present invention comprises: the substrate 1; the interlayer insulating film 3 on the substrate 1; the plug underlying film 5 composed of a TiN/Ti film formed on the side and bottom faces of the connection hole formed in a part of the interlayer insulating film 3; the W plug 6 formed from tungsten filled in the contact hole and brought into contact with a conductive layer 1a in an active region of the substrate 1 via the plug underlying film 5; a metal interconnection 16 made of an alloy of Al and connected to the plug 6 via an interconnection underlying film 14; an interconnection overlying film 17 formed from titanium nitride on the metal interconnection 16 so as to prevent reflection; and a protective oxide film 18 deposited over the interlayer insulating film 3 and the interconnection overlying film 17. The present embodiment is characterized in that the above interconnection underlying film 14 is composed of a titanium film and that the reaction layer 15 made of an alloy of Al and Ti resulting from the reaction between the alloy of aluminum composing the metal interconnection 16 and titanium composing the interconnection underlying film 14 is formed between the interconnection underlying film 14 and the metal interconnection 16. A preferable temperature for forming the alloy layer of Al and Ti is about 350° to 430° C.

In the present embodiment, the existence of the reaction layer 15 prevents the formation of the alloy layer ($WAl_{12}$) resulting from the diffusion of the aluminum atoms composing the metal interconnection 16 and the tungsten atoms composing the W plug 6. Specifically, since the reaction layer 15 made of the alloy of Al and Ti exists between the metal interconnection 16 and the interconnection underlying film 14, there is prevented the formation of the alloy layer ($WAl_{12}$) resulting from the reciprocal diffusion of the aluminum atoms and tungsten atoms through the boundary region between the protective oxide film 18 and the interconnection underlying film 14. Consequently, the same effect as achieved in the above individual embodiments can also be achieved in the present embodiment.

Figure 12:
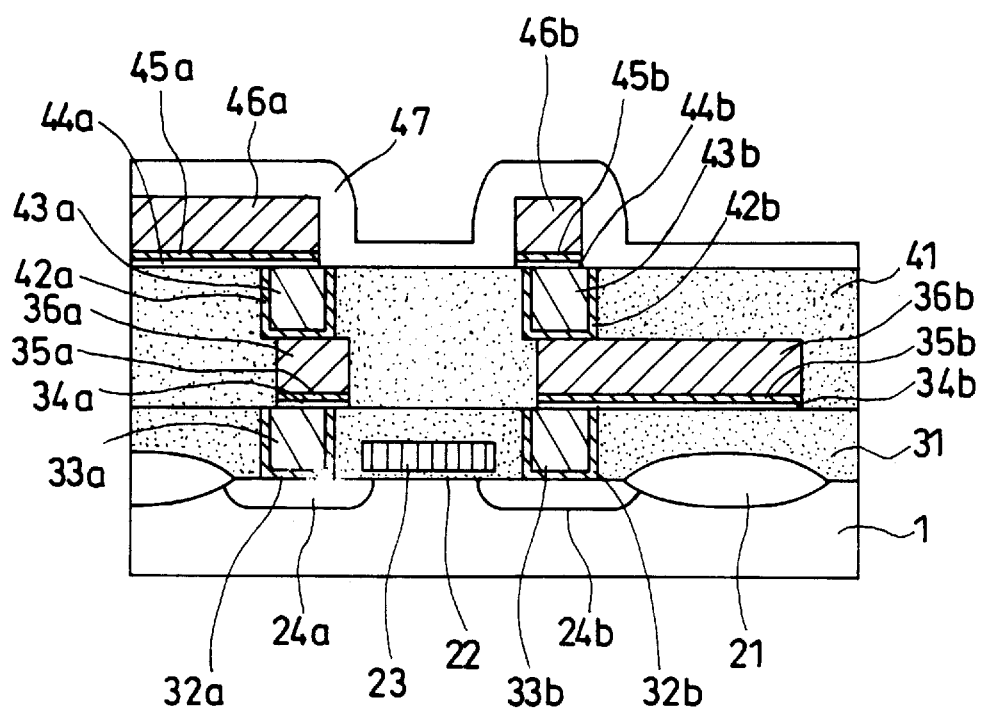
FIG. 12 is a cross-sectional view showing the structure of a semiconductor device according to a variation of the ninth embodiment.

Next, a description will be given to a variation of the present embodiment. FIG. 12 is a cross-sectional view of a semiconductor device according the variation of the present embodiment. As shown in the drawing, the semiconductor substrate 1 is provided with: an isolation 21; a gate insulating film 22 and a gate electrode 23 formed on an active region surrounded by the isolation 21; a source region 24a and a drain region 24b formed by introducing an impurity into these portions of the semiconductor substrate 1 located on both sides of the gate electrode 23; a first interlayer insulating film 31 deposited on the semiconductor substrate 1; a first plug underlying film 32a and a first W plug 33a and a first plug underlying film 32b and a first W plug 33b which are filled in respective contact holes formed in the above source region 24a and drain region 24b; first metal interconnections 36a and 36b each formed from an alloy of aluminum on the first interlayer insulating film 31 and connected to the first W plugs 33a and 33b, respectively; and first interconnection underlying films 34a and 34b formed from titanium. Between the first interconnection underlying films 34a and 34b and the first metal interconnections 36a and 36b are formed first reaction layers 35a and 35b made of an alloy of Al and Ti, respectively. The structure is provided between the first metal interconnections 36a and 36b and the second metal interconnections 46a and 46b. Specifically, there are provided: a second underlying film 42a and a second W plug 43a and a second plug underlying film 42b and a second W plug 43b filled in via holes formed in a second interlayer insulating film 41 and connected to the first metal interconnections 36a and 36b, respectively; second interconnection underlying films 44a and 44b; second reaction layers 45a and 45b; and the second metal interconnections 46a and 46b. In the uppermost layer is formed a protective oxide film 47.

In the variation, since no margin for mask alignment is provided between the above first metal interconnections 36a and 36b and the first W plugs 33a and 33b and between the second metal interconnections 46a and 46b and the second W plugs 43a and 43b, they are not overlapping with each other completely. In this case also, the formation of the alloy layer ($WAl_{12}$) in the vicinity of respective contact areas can effectively be prevented, since the respective reaction layers 35a and 35b and 45a and 45b have been formed.

(Other Embodiments)

It is also possible to add the structures of the above first to eighth embodiments to the above ninth embodiment. The arrangement is advantageous in that the formation of the alloy layer ($WAl_{12}$) can more effectively be prevented.

Figure 13A:
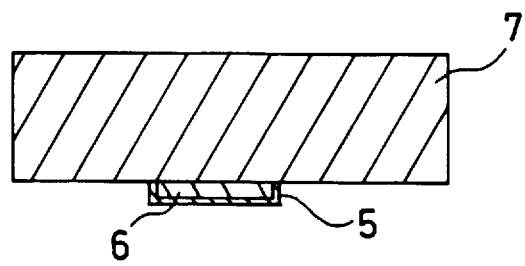
FIGS. 13(a) and 13(b) are views showing displacements of the metal interconnection and the W plug in the individual embodiments.
Figure 13B:
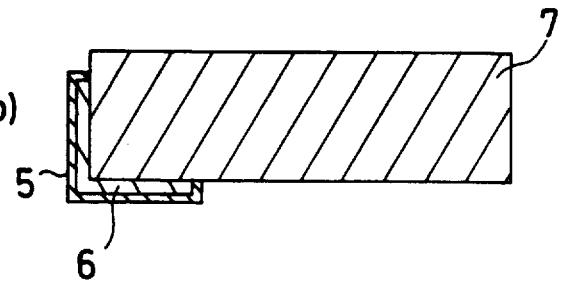

It will be appreciated that, in each of the above embodiments, the effects of the respective embodiments can effectively be exerted even on a displacement of an intermediate portion of a metal interconnection and a filled plug, as shown in FIG. 13(a), and on a displacement of an edge portion of the metal interconnection and the filled plug, as shown in FIG. 13(b).

In the case of performing the same process steps as shown in FIGS. 15(a) to 15(d), if the temperature for the thermal treatment for damage restoration is shifted from 450° C. in the conventional embodiment to a range of 300° C. to 400° C., a certain degree of effect can be obtained.

FIG. 14(a) shows variations in resistance value of metal interconnections which connect 1000 via holes filled with W plugs in series and which have been subjected to a thermal treatment. The measurements were obtained as a result of an experiment in which the thermal treatment was performed at different temperatures. FIG. 14(b) is a cross-sectional view showing the structure of a semiconductor device used in obtaining the data shown in FIG. 14(a). In the structure, the diameter of each of the connection holes is 0.6 $\mu$m and a displacement of respective patterns for forming the connection hole and for the upper metal interconnection is 0.1 μm, as shown in FIG. 14(b). When the temperature for the thermal treatment is 400° C. or over, there is observed an increase in resistance due to the formation of the alloy $WAl_2$. When the temperature for the thermal treatment is 300° C. or under, on the other hand, the damage caused to the underlay by dray etching is restored only insufficiently, so that the contact resistance of a contact is disadvantageously increased.

The thermal treatment performed in a temperature range of 300° C. to 400° C. enables the restoration of the underlying damaged layer and the prevention of an increase in resistance due to the alloy layer ($WAl_{12}$).

We claim:

1. A method of manufacturing a semiconductor device comprising:

a first step of forming a dielectric film on a semiconductor substrate having a conductive layer;

a second step of forming a connection hole which penetrates said dielectric film and leads to said conductive layer;

a third step of forming a metal plug composed of a refractory metal in said connection hole;

a fourth step of depositing, over said dielectric film and said metal plug, a first metal film to form an interconnection underlying film;

a fifth step of depositing, on said first metal film, a second metal film composed of a metal which reacts with said refractory metal composing said metal plug so as to form a compound having an electrical resistance higher than that of said first and second metal films and said metal plug;

a sixth step of forming a photoresist mask on said second metal film such that said photoresist mask covers at least a part of said metal plug;

a seventh step of selectively removing said second metal film by etching using said photoresist mask so as to form a metal interconnection to be connected to said metal plug;

an eighth step of etching away that part of said first metal film which has its top surface exposed in said seventh step, wherein another part of said metal plug is uncovered; and a ninth step of forming, over the uncovered part of said metal plug a diffusion preventing film for preventing respective constituent atoms of said metal interconnection and said metal plug from being reciprocally diffused.

2. A method of manufacturing a semiconductor device according to claim 1, wherein in said third step, said metal plug is composed of tungsten, in said fourth step, said first metal film is composed of a metal containing titanium, in said fifth step, said second metal film is composed of a metal containing aluminum, and in said ninth step, said diffusion preventing film is composed of a compound containing titanium.

3. A method of manufacturing a semiconductor device according to claim 2, wherein each of said seventh step and said eighth step is performed by dry etching and said diffusion preventing film is formed by depositing a compound containing titanium resulting from a reaction between titanium atoms liberated in etching said first metal film and a decomposition product of said etchant gas over that part of said metal plug which has its top surface exposed.

4. A method of manufacturing a semiconductor device according to claim 3, wherein said diffusion preventing film formed in said ninth step has a thickness of 5 to 20 nm.

5. A method of manufacturing a semiconductor device according to claim 2, wherein said ninth step is performed by dry etching using a gas containing fluorine so as to compose said diffusion preventing film of a titanium fluoride.

6. A method of manufacturing a semiconductor device according to claim 5, wherein said gas containing fluorine is at least any one of a group consisting of $SF_6$ gas, $CF_4$ gas, $CHF_3$ gas, and $NF_3$ gas.

7. A method of manufacturing a semiconductor device according to claim 1, wherein in said ninth step, after said photoresist mask is removed, a film composed of a material having the function of preventing the respective constituent atoms of said metal interconnection and said metal plug from being reciprocally diffused is deposited over said metal interconnection, the exposed part of said metal plug, and said dielectric film and said film is etched back so as to form sidewalls extending over respective side faces of said metal interconnection and said first metal film and a part of the top surface of said metal plug.

8. A method of manufacturing a semiconductor device according to claim 7, wherein said film deposited in said ninth step so as to form said sidewalls is a silicon nitride film.

9. A method of manufacturing a semiconductor device according to claim 7, further comprising the step of after said fifth step and prior to said sixth step, depositing a protective insulating film on said second metal film, wherein in said ninth step, said film is composed of a titanium film and said sidewalls are formed to extend over respective side faces of said first and second metal films and a part of the top surface of said metal plug.

10. A method of manufacturing a semiconductor device comprising:

a first step of forming a dielectric film on a semiconductor substrate having a conductive layer;

a second step of forming a connection hole which penetrates said dielectric film and leads to said conductive layer;

a third step of forming a metal plug composed of a refractory metal in said connection hole;

a fourth step of depositing, over said dielectric film and said metal plug, a first metal film to form an interconnection underlying film;

a fifth step of depositing, on said first metal film, a second metal film composed of a metal which reacts with said refractory metal composing said metal plug so as to form a compound having an electrical resistance higher than that of said first and second metal films and said metal plug;

a sixth step of forming a photoresist mask on said second metal film such that said photoresist mask covers at least a part of said metal plug;

a seventh step of selectively removing said second metal film by etching using said photoresist mask so as to form a metal interconnection to be connected to said metal plug;

an eighth step of etching away that part of said first metal film which has its top surface exposed in said seventh step,
   wherein another part of said metal plug is uncovered; and
a ninth step of forming a recessed portion by etching away that part of said metal plug which is uncovered from a top surface thereof to a specified depth.

11. A method of manufacturing a semiconductor device according to claim 10, wherein
   said recessed portion formed in said ninth step has a depth of about 100 nm.

12. A method of manufacturing a semiconductor device according to claim 1, wherein
   said third step is performed so as to add an underlying film to said metal plug.

13. A method of manufacturing a semiconductor device comprising:
   a first step of forming a dielectric film on a semiconductor substrate having a conductive layer;
   a second step of forming a connection hole which penetrates said dielectric film and leads to said conductive layer;
   a third step of depositing, over side and bottom faces of said contact hole and said dielectric film, a first metal film to form an interconnection underlying film;
   a fourth step of forming a metal plug composed of a refractory metal on said first metal film in said connection hole;
   a fifth step of depositing, over said first metal film and said metal plug, a second metal film to form an interconnection underlying film;
   a sixth step of depositing, on said second metal film, a third metal film composed of a metal which reacts with said refractory metal composing said metal plug so as to form a compound having an electrical resistance higher than that of said first and second metal films and said metal plug;
   a seventh step of forming a photoresist mask on said third metal film such that it covers at least a part of said metal plug;
   an eighth step of selectively removing said second and third metal films, while leaving said first metal film, by etching using said photoresist mask so as to form a metal interconnection to be connected to said metal plug,
      wherein another part of said metal plug is uncovered; and
   a ninth step of forming, over the uncovered part of said metal plug, a diffusion preventing film for preventing respective constituent atoms of said metal interconnection and said metal plug from being reciprocally diffused, while etching away that part of said first metal film which has its top surface exposed in said eighth step.

14. A method of manufacturing a semiconductor device comprising:
   a first step of forming a dielectric film on a semiconductor substrate having a conductive layer;
   a second step of depositing, on said dielectric film, a first metal film to form an interconnection underlying film;
   a third step of forming a connection hole which penetrates said first metal film and said dielectric film and leads to said conductive layer;
   a fourth step of forming a metal plug composed of a refractory metal in said connection hole;
   a fifth step of depositing, over said first metal film and said metal plug, a second metal film to form an interconnection underlying film;
   a sixth step of depositing, on said second metal film, a third metal film composed of a metal which reacts with said refractory metal composing said metal plug so as to form a compound having an electrical resistance higher than that of said first and second metal films and said metal plug;
   a seventh step of forming a photoresist mask on said third metal film such that it covers at least a part of said metal plug;
   an eighth step of selectively removing said second and third metal films, while leaving said first metal film, by etching using said photoresist mask so as to form a metal interconnection to be connected to said metal plug,
      wherein another part of said metal plug is uncovered; and
   a ninth step of forming, over the uncovered part of said metal plug, a diffusion preventing film for preventing respective constituent atoms of said metal interconnection and said metal plug from being reciprocally diffused, while etching away that part of said first metal film which has its top surface exposed in said eighth step.

15. A method of manufacturing a semiconductor device comprising:
   a first step of forming a dielectric film on a semiconductor substrate having a conductive layer;
   a second step of forming a connection hole which penetrates said dielectric film and leads to said conductive layer;
   a third step of forming a metal plug composed of a metal containing at least tungsten in said connection hole;
   a fourth step of depositing a first metal film composed of a metal containing titanium over said dielectric film and said metal plug;
   a fifth step of depositing a second metal film composed of a metal containing aluminum on said first metal film;
   a sixth step of forming a reaction layer composed of a compound of titanium and aluminum between said first metal film and said second metal film through a heating process at 350° C. to 430° C.;
   a seventh step of forming a photoresist mask on said second metal film such that it covers at least a part of said metal plug;
   an eighth step of selectively removing said second metal film by etching using said photoresist mask so as to form a metal interconnection to be connected to said metal plug;
   a ninth step of etching away that part of said first metal film which has its top surface exposed in said eighth step,
      wherein another part of said metal plug is uncovered; and
   a tenth step of, forming a diffusion preventing film for preventing respective constituent atoms of said metal interconnection and said metal plug from being reciprocally diffused over that part of said metal plug which is uncovered.

16. A method of manufacturing a semiconductor device according to claim 15, wherein each of said ninth step and said tenth step is performed by dry etching and said diffusion preventing film is formed by depositing a compound of titanium resulting from a reaction between titanium atoms liberated in etching said first metal film and a decomposition product of said etchant gas over that part of said metal plug which has its top surface exposed.

17. A method of manufacturing a semiconductor device according to claim 15, wherein in said tenth step, after said photoresist mask is removed, a film composed of a material having the function of preventing the respective constituent atoms of said metal interconnection and said metal plug from being reciprocally diffused is deposited over said metal interconnection, the exposed part of said metal plug, and said dielectric film and said film is etched back so as to form sidewalls extending over respective side faces of said metal interconnection and said first metal film and a part of the top surface of said metal plug.

18. A method of manufacturing a semiconductor device comprising:

a first step of forming a dielectric film on a semiconductor substrate having a conductive layer;

a second step of forming a connection hole which penetrates said dielectric film and leads to said conductive layer;

a third step of forming a metal plug composed of a metal containing at least tungsten in said connection hole;

a fourth step of depositing a first metal film composed of a metal containing titanium over said dielectric film and said metal plug;

a fifth step of depositing a second metal film composed of a metal containing aluminum on said first metal film;

a sixth step of forming a reaction layer composed of a compound of titanium and aluminum between said first metal film and said second metal film through a heating process at 350° C. to 430° C.;

a seventh step of forming a photoresist mask on said second metal film such that it covers at least a part of said metal plug;

an eighth step of selectively removing said second metal film by etching using said photoresist mask so as to form a metal interconnection to be connected to said metal plug;

a ninth step of etching away that part of said first metal film which has its top surface exposed in said eighth step, wherein another part of said metal plug is uncovered; and a tenth step of, etching away that part of said metal plug which is uncovered from a top surface thereof to a specified depth.

* * * * *